US012635508B2

(12) United States Patent
Do et al.

(10) Patent No.: US 12,635,508 B2
(45) Date of Patent: May 19, 2026

(54) INTEGRATED CIRCUIT INCLUDING STANDARD CELL AND A METHOD FOR FABRICATING THE SAME

(71) Applicant: SAMSUNG ELECTRONICS CO., LTD., Suwon-si (KR)

(72) Inventors: Jungho Do, Hwaseong-si (KR); Minjae Jeong, Yongin-si (KR); Geonwoo Nam, Hwaseong-si (KR); Jaehee Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 701 days.

(21) Appl. No.: 17/981,100

(22) Filed: Nov. 4, 2022

(65) Prior Publication Data

US 2023/0143562 A1    May 11, 2023

(30) Foreign Application Priority Data

Nov. 5, 2021    (KR) ......................... 10-2021-0151665

(51) Int. Cl.
    *H10D 64/23*    (2025.01)
    *G06F 30/3953*    (2020.01)
    *H10W 20/43*    (2026.01)

(52) U.S. Cl.
    CPC ........ *H10W 20/43* (2026.01); *G06F 30/3953* (2020.01); *H10D 64/251* (2025.01)

(58) Field of Classification Search
    None
    See application file for complete search history.

(56) References Cited

U.S. PATENT DOCUMENTS

| | | | |
|---|---|---|---|
| 9,653,413 | B2 | 5/2017 | Frederick, Jr. et al. |
| 9,978,682 | B1 | 5/2018 | Correale, Jr. et al. |
| 10,290,582 | B2 | 5/2019 | Yuan et al. |
| 10,460,067 | B2 | 10/2019 | Sherazi et al. |
| 10,658,292 | B2 | 5/2020 | Peng et al. |
| 11,094,686 | B2 | 8/2021 | Kim |
| 2010/0187573 | A1 | 7/2010 | Iwata |
| 2016/0133569 | A1* | 5/2016 | Song ................... H10D 84/859 |
| | | | 257/369 |

(Continued)

FOREIGN PATENT DOCUMENTS

KR    10 2020 0092020 A    8/2020

OTHER PUBLICATIONS

Communication dated Sep. 11, 2025 issued by the Korean Intellectual Property Office in Korean Patent Application No. 10-2021-0151665.

*Primary Examiner* — Xiaoming Liu
(74) *Attorney, Agent, or Firm* — Sughrue Mion, PLLC

(57) ABSTRACT

Provided are an integrated circuit including a first standard cell including a first metal layer including a plurality of tracks respectively extending in a first horizontal direction and spaced apart from each other in a second horizontal direction, a jog pattern that includes a conductive pattern formed on a track selected from the plurality of tracks, and a connection pattern formed off the plurality of tracks, a plurality of gate lines respectively extending in the second horizontal direction, and a gate contact configured to connect a gate line selected from the plurality of gate lines to the first metal layer to connect the connection pattern to the selected gate line, and a method for fabricating the same.

16 Claims, 16 Drawing Sheets

(56) References Cited

U.S. PATENT DOCUMENTS

| 2017/0098641 A1* | 4/2017 | Jung .................... H10D 62/115 |
| 2020/0104451 A1 | 4/2020 | Huang et al. |
| 2020/0251464 A1 | 8/2020 | Gadigatla et al. |
| 2021/0125917 A1 | 4/2021 | Bansal et al. |
| 2021/0125926 A1 | 4/2021 | Le Bars |

* cited by examiner

START

FLIP AND ARRANGE STANDARD CELL IN
WHICH CONNECTION CONTACT IS FORMED — S21'

ARRANGE FILLER CELL BETWEEN ADJACENT
CELL AND FLIPPED STANDARD CELL — S23'

END

INTEGRATED CIRCUIT INCLUDING STANDARD CELL AND A METHOD FOR FABRICATING THE SAME

CROSS-REFERENCE TO RELATED APPLICATION

This application claims priority to Korean Patent Application No. 10-2021-0151665, filed on Nov. 5, 2021, in the Korean Intellectual Property Office, the disclosure of which is incorporated herein in its entirety by reference.

BACKGROUND

Example embodiments of the present disclosure relate to an integrated circuit, and more particularly, to an integrated circuit including a standard cell.

An integrated circuit may be designed based on standard cells. In detail, a layout of an integrated circuit may be generated by arranging standard cells according to data defining the integrated circuit, and routing the arranged standard cells. As a semiconductor fabrication process is refined, the size of patterns within a standard cell may decrease, and the size of the standard cell may also decrease. As a gate length of devices and a pitch between gate lines continuously decrease in an integrated circuit, the density of lines for connecting semiconductor devices has also increased.

SUMMARY

Embodiment provide an integrated circuit in which operation characteristics of a standard cell are improved due to a large width of an active region, and routing for interconnecting standard cells is more easily formed by reducing the density of upper lines formed on a metal layer.

The technical problems are not limited to the technical problems mentioned above, and other technical problems that are unmentioned will be clearly understood by one of ordinary skill in the art from the following description.

According to an aspect of an example embodiment, there is provided an integrated circuit including a first standard cell including a first metal layer including a plurality of tracks respectively extending in a first horizontal direction and spaced apart from each other in a second horizontal direction, a jog pattern that includes a conductive pattern formed on a track selected from the plurality of tracks, and a connection pattern formed off the plurality of tracks, a plurality of gate lines respectively extending in the second horizontal direction, and a gate contact configured to connect a gate line selected from the plurality of gate lines to the first metal layer to connect the connection pattern to the selected gate line.

According to another aspect of an example embodiment, there is provided an integrated circuit including a first standard cell defined by a cell boundary, the first standard cell including a first active region and a second active region respectively extending in a first horizontal direction, a boundary area including a diffusion break configured to cut the first active region and the second active region, the boundary area being in contact with the cell boundary, a first active contact formed to contact the first active region, and a connection contact connected to the first active contact that is formed in the boundary area, and extending in a second horizontal direction.

According to another aspect of an example embodiment, there is provided a method of fabricating an integrated circuit based on a standard cell library, the method including forming a standard cell defined by a cell boundary, and generating layout data by generating an interconnection between the standard cell and an adjacent cell, wherein the standard cell includes a first active region and a second active region respectively extending in a first horizontal direction, a first active contact formed to contact the first active region, and a connection contact connected to the first active contact and formed on the cell boundary, and extending in a second horizontal direction.

BRIEF DESCRIPTION OF THE DRAWINGS

The above and/or other aspects and features of the present disclosure will become more apparent by describing in detail example embodiments thereof with reference to the attached drawings, in which:

The accompanying drawings may not fit to scale for convenience of illustration, and may illustrate components by exaggerating or reducing the components.

FIG. 7 is a plan view illustrating standard cells having various layouts, included in an integrated circuit according to an example embodiment;

DETAILED DESCRIPTION OF THE EMBODIMENTS

Hereinafter, embodiments will be explained in detail with reference to the accompanying drawings. Embodiments described herein are example embodiments, and thus, the disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
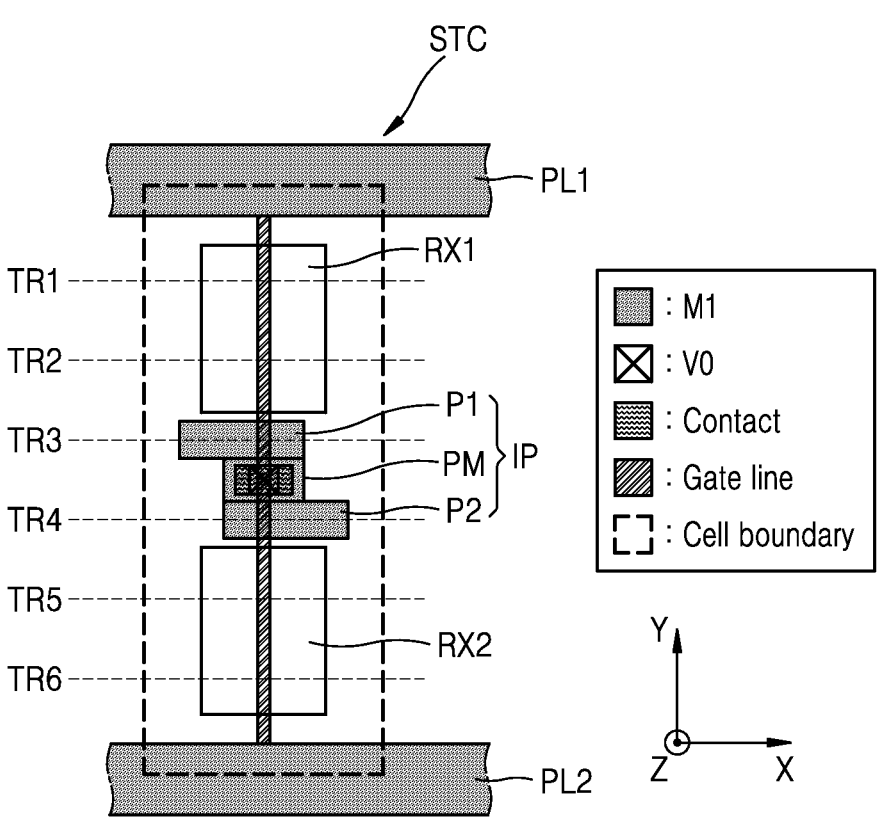
FIGS. 1 and 2 are plan views illustrating a standard cell included in an integrated circuit according to example embodiments.
Figure 2:
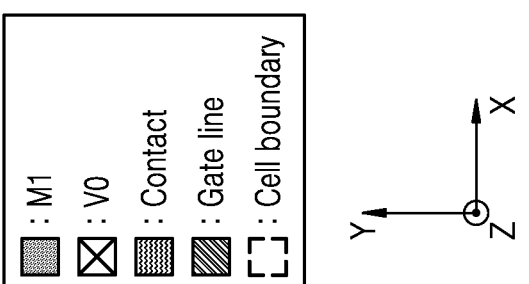
Figure 2:
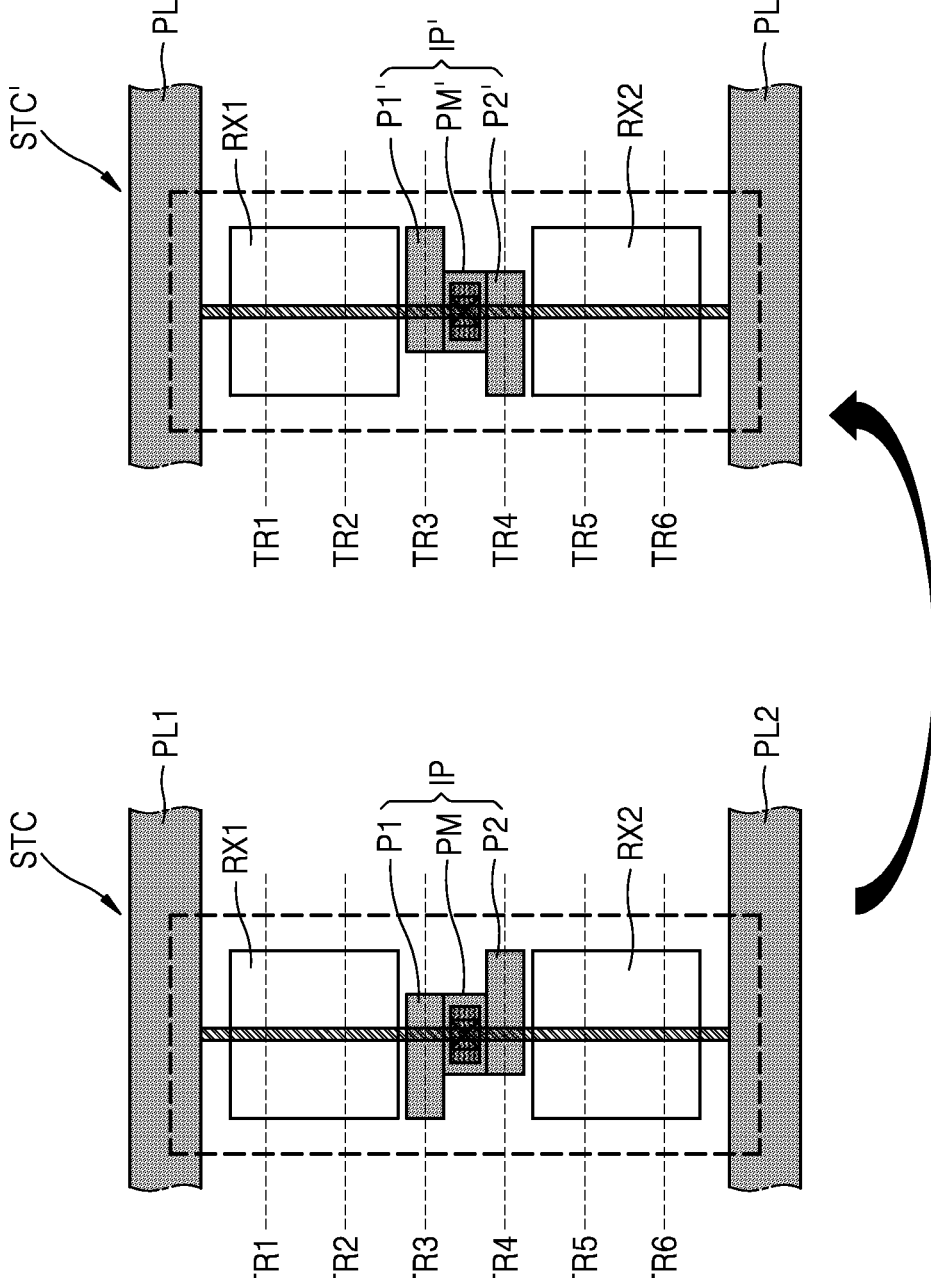

FIGS. 1 and 2 are plan views illustrating a standard cell included in an integrated circuit, according to example embodiments. FIGS. 1 and 2 are plan views illustrating standard cells STC and STC' on a plane including an X axis and a Y axis. Herein, an X-axis direction and a Y-axis direction may be referred to as a first horizontal direction and a second horizontal direction, respectively, and a Z-axis direction may be referred to as a vertical direction. The plane including the X axis and the Y axis may be referred to as a horizontal plane, a component arranged in a +Z-axis direction relatively with respect to another component may be referred to as being above the other component, and a component arranged in a −Z-axis direction relatively with respect to another component may be referred to as being under the other component.

An integrated circuit may include a plurality of standard cells. A standard cell may be a unit of a layout included in an integrated circuit, may be designed to perform a predefined function, and may also be referred to as a cell. An integrated circuit may include a plurality of various types of standard cells.

A plurality of standard cells are repeatedly used in the design of an integrated circuit. Standard cells may be predesigned according to fabrication technology and stored in a standard cell library, and the standard cells stored in the standard cell library may be arranged and interconnected according to design rules, thereby designing an integrated circuit.

For example, standard cells may include various types of basic circuits, such as an inverter, an AND gate, a NAND gate, an OR gate, an XOR gate, and a NOR gate, which are frequently used in the design of digital circuits for an electronic device, such as a central processing unit (CPU), a graphics processing unit (GPU), and a system on chip (SOC). Alternatively, for example, standard cells may also include other types of circuits, such as a flip-flop circuit and a latch circuit, which are frequently used in circuit blocks.

Standard cells may include a filler cell. The filler cell may be arranged adjacent to a functional cell to provide routing of signals provided to the functional cell or output from the functional cell. Also, the filler cell may be a cell used to fill a space remaining after functional cells are arranged.

Metal layers, on which lines for interconnecting standard cells are formed, may be formed in an integrated circuit. Some of the metal layers may be used as components for interconnecting internal elements inside a standard cell.

Patterns formed on each of the metal layers may be formed of metal, conductive metal nitride, metal silicide, or a combination thereof. In the accompanying drawings, only some layers may be shown for convenience of illustration, and a via is located underneath a pattern of a metal layer, but may be illustrated to show a connection between the pattern of the metal layer and a lower pattern.

In an integrated circuit, a first power line PL1 and a second power line PL2 supplying voltages to each of standard cells may be formed. The first power line PL1 may provide a first supply voltage (e.g., a power supply voltage VDD) to each of the standard cells, and the second power line PL2 may provide a second supply voltage (e.g., a ground voltage VSS) to each of the standard cells. The first power line PL1 and the second power line PL2 may be formed as conductive patterns extending in an X-axis direction, and may be alternately arranged with each other in a Y-axis direction. FIGS. 1 and 2 illustrate that the first power line PL1 and the second power line PL2 are each formed as a pattern of a first metal layer M1. However, the integrated circuit (e.g., the integrated circuit 10 of FIG. 3) according to embodiments are not limited thereto. For example, the first power line PL1 and the second power line PL2 may each be formed as a pattern of an upper metal layer of the first metal layer M1, or may each be formed inside an isolation trench formed in a substrate.

Referring to FIG. 1, the standard cell STC may be defined by a cell boundary. A double diffusion break (DDB) or a single diffusion break (SDB) may be formed at the cell boundary.

The standard cell STC may include gate lines extending in the Y-axis direction, and may include active regions extending in the X-axis direction. An active region and a gate line included in the standard cell STC may form a transistor. In an example embodiment, a gate line may include a work function metal-containing layer and a gap-fill metal layer. For example, the work function metal-containing layer may include at least one of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), and the gap-fill metal layer may include a W layer or an Al layer. In an example embodiment, a gate line may include a stacked structure of titanium aluminum carbide/titanium nitride/tungsten (TiAlC/TiN/W), a stacked structure of titanium nitride/tantalum nitride/titanium nitride/titanium aluminum carbide/tungsten (TiN/TaN/TiAlC/TiN/W), or a stacked structure of titanium nitride/tantalum nitride/titanium nitride/titanium aluminum carbide/titanium nitride/tungsten (TiN/TaN/TiN/TiAlC/TiN/W).

The active regions may include a first active region RX1 and a second active region RX2. In an example embodiment, the second active region RX2 may be formed on a substrate doped with P-type impurities, and the first active region RX1 may be formed in an N-well formed within the substrate. The first active region RX1 may form a P-type transistor together with a gate line, and the second active region RX2 may form an N-type transistor together with a gate line.

The substrate may include semiconductor such as silicon (Si) or germanium (Ge), or a group III-V compound such as gallium arsenide (GaAs), aluminum gallium arsenide (AlGaAs), indium arsenide (InAs), indium gallium arsenide (InGaAs), indium antimonide (InSb), gallium antimonide (GaSb), indium gallium antimonide (InGaSb), indium phosphide (InP), gallium phosphide (GaP), indium gallium phosphide (InGaP), indium nitride (InN), gallium nitride (GaN), or indium gallium nitride (InGaN). In an example embodiment, the substrate may be a silicon-on-insulator (SOI) substrate or a germanium-on-insulator (GOI) substrate.

In an example embodiment, a plurality of fins may be formed in each of the first active region RX1 and the second active region RX2. The plurality of fins may extend parallel to each other in the X-axis direction. For example, three or four fins may be formed in each of the first active region RX1 and the second active region RX2, but the number of fins formed in each of the first active region RX1 and the second active region RX2 may be variously modified.

However, the standard cell STC according to the embodiment is not limited thereto, and a nanosheet may also be formed in each of the first active region RX1 and the second active region RX2. For example, a multi bridge channel (MBC) FET, in which a plurality of nanosheets are stacked, and a gate line surrounds the plurality of nanosheets, may be formed in each of the first active region RX1 and the second active region RX2. According to another embodiment, for example, in each of the first active region RX1 and the second active region RX2, a gate-all-around FET, in which a nanowire is surrounded by a gate line, may be formed, or a vertical gate-all-around (GAA) FET, in which a plurality of nanowires stacked are surrounded by a gate line, may be formed. In addition, for example, a negative capacitance (NC) FET may be formed in each of the first active region RX1 and the second active region RX2. In addition to the transistors described above, various types of transistors (e.g., a complementary FET (CFET), a negative FET (NFET), a carbon nanotube (CNT) FET, a bipolar junction transistor, and other three-dimensional transistors) may be formed in each of the first active region RX1 and the second active region RX2.

A plurality of tracks, on which patterns of the first metal layer M1 are respectively arranged, may be defined in the integrated circuit. The first metal layer M1 may be the lowermost metal layer from among a plurality of metal layers. The plurality of tracks may extend in the X-axis direction, and may be spaced apart from each other in the Y-axis direction. For example, a first track TR1, a second track TR2, a third track TR3, a fourth track TR4, a fifth track TR5, and a sixth track TR6 may be formed in the standard cell STC. Conductive patterns extending in the X-axis direction may be respectively formed on the first to sixth tracks TR1 to TR6. The number of tracks of the first metal layer M1 formed in the standard cell STC may be variously modified.

In an example embodiment, the standard cell STC may include a pattern of the first metal layer M1 that is a jog pattern. For example, an input pin IP of the standard cell STC may be formed as a jog pattern.

In the standard cell STC, the input pin IP, through which an input signal is received, may be formed on the first metal layer M1, and the input pin IP may include a first conductive pattern P1 and a second conductive pattern P2, which are on-track patterns arranged on a plurality of tracks, and a connection pattern PM, which is an off-track pattern arranged off the plurality of tracks. For example, the standard cell STC may include the connection pattern PM arranged to deviate from the plurality of tracks.

In an example embodiment, a portion of the input pin IP of the standard cell STC, close to the cell boundary, may be formed as an on-track pattern. For example, the input pin IP may include the first conductive pattern P1 arranged on the third track TR3, the second conductive pattern P2 arranged on the fourth track TR4, and the connection pattern PM in contact with the first conductive pattern P1 and the second conductive pattern P2, between the third track TR3 and the fourth track TR4. A contact and a first via V0 that connects a gate line to the connection pattern PM may be formed under the connection pattern PM.

The standard cell STC may be designed such that each of the first active region RX1 and the second active region RX2, and the contact (e.g., a gate contact) formed on the gate line may be spaced apart from each other by a certain distance or more. In addition, the standard cell STC may be designed such that a contact (i.e., an active contact) formed on each of the first active region RX1 and the second active region RX2, and the gate contact may be spaced apart from each other by a certain distance or more. Accordingly, the input pin IP of the standard cell STC according to the embodiment may include the connection pattern PM formed to deviate from the plurality of tracks while being electrically connected to the gate line via the gate contact, such that the first active region RX1 and the second active region RX2 may each be formed to have a relatively large width. As the width of the first active region RX1 and the second active region RX2 increases, current characteristics of the transistors formed in the standard cell STC may be improved, and the performance of the standard cell STC may be improved.

In addition, the input pin IP of the standard cell STC according to the embodiment may include the first conductive pattern P1 and the second conductive pattern P2 formed on the plurality of tracks, and thus, an interconnection with another cell may be more easily formed by using at least one of the first conductive pattern P1 and the second conductive pattern P2.

Referring to FIG. 2, the standard cell STC' may be arranged in an integrated circuit. The standard cell STC' may have a structure in which a gate line, a first active region RX1, a second active region RX2, a contact, a first via V0, and a pattern of a first metal layer M1 are respectively symmetrical in the Y-axis direction with respect to the gate line, the first active region RX1, the second active region RX2, the contact, the first via V0, and the pattern of the first metal layer M1 of the standard cell STC described above with reference to FIG. 1. In an example embodiment, the standard cell STC and the standard cell STC' may have a structure in which patterns of second metal layers that are upper layers of the first metal layers M1 are symmetrical to each other in the Y-axis direction, or are not symmetrical to each other.

In the integrated circuit according to the embodiment, the standard cell STC or the standard cell STC' may be selectively arranged by considering the ease of the formation of an interconnection (i.e., routing) with an adjacent cell. In addition, the integrated circuit may include both the standard cell STC and the standard cell STC'.

Figure 3:
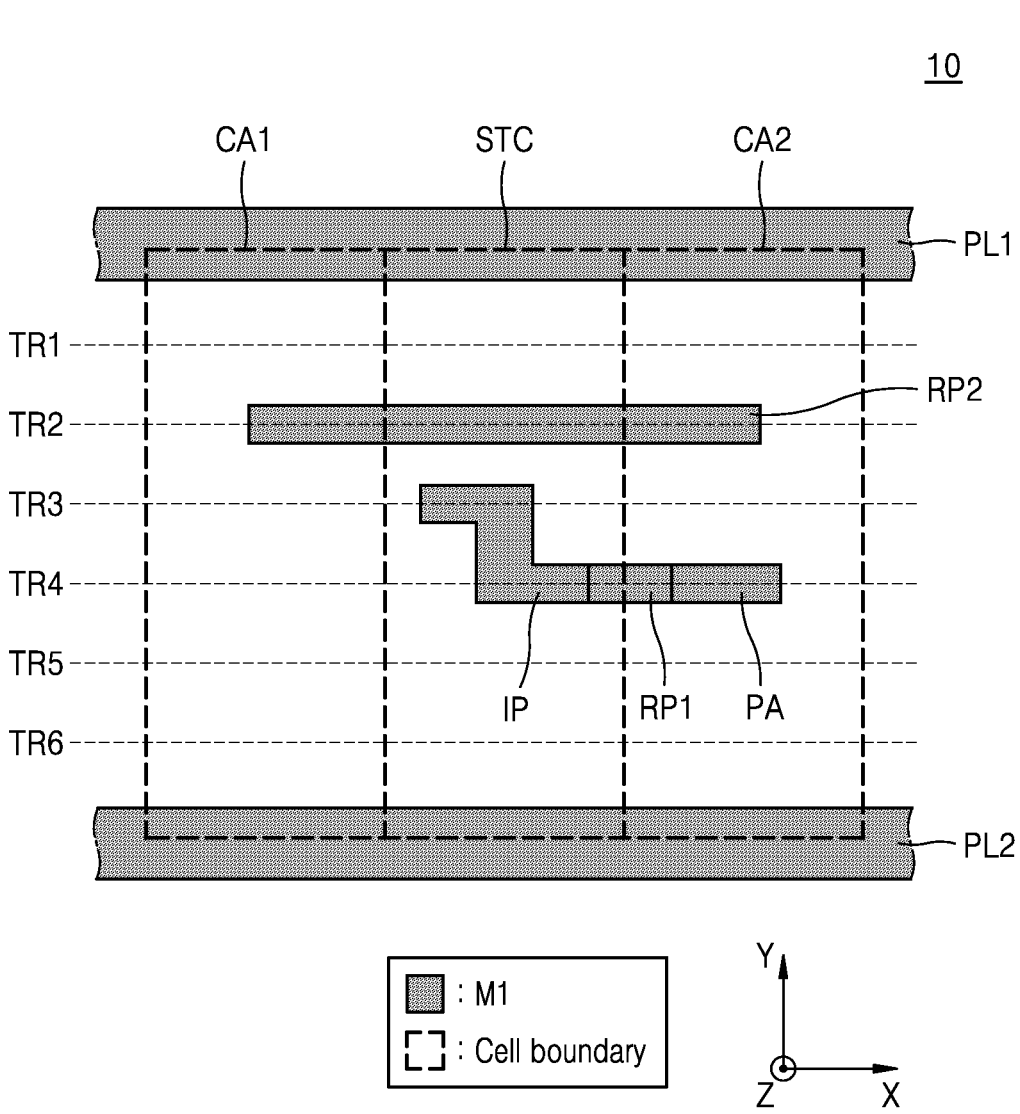
FIG. 3 is a plan view illustrating an integrated circuit according to an example embodiment.

FIG. 3 is a plan view illustrating an integrated circuit according to an example embodiment. FIG. 3 is a plan view illustrating standard cells and some of patterns of a first metal layer M1, included in an integrated circuit.

Referring to FIG. 3, an integrated circuit 10 may include a standard cell STC, and a first adjacent cell CA1 and a second adjacent cell CA2 arranged adjacent to the standard cell STC. The first adjacent cell CA1 may be arranged adjacent to the standard cell STC in a −X-axis direction (a reverse direction of the X-axis direction), and the second adjacent cell CA2 may be arranged adjacent to the standard cell STC in an X-axis direction.

The standard cell STC may include an input pin IP, which is formed as a pattern of the first metal layer M1 and through which an input signal is received. The input pin IP may include patterns formed on at least one of a plurality of tracks, e.g., a third track TR3 and a fourth track TR4. The second adjacent cell CA2 may include a pattern PA formed on the fourth track TR4, and the input pin IP of the standard cell STC and the pattern PA of the second adjacent cell CA2 may be electrically connected to each other via a first routing line RP1 formed on the fourth track TR4. Here, the pattern PA of the second adjacent cell CA2 may be an input pin or an output pin of the second adjacent cell CA2.

In an example embodiment, when the pattern PA of the second adjacent cell CA2 is formed on the third track TR3 and not on the fourth track TR4, in the integrated circuit 10, the standard cell STC' of FIG. 2 may be arranged instead of the standard cell STC, or the standard cell STC may be flipped with respect to the Y-axis and arranged.

A second routing line RP2 may be formed on a track on which the pattern of the first metal layer M1 is not formed inside the standard cell STC, e.g., a second track TR2. The second routing line RP2 may be a line for interconnecting the first adjacent cell CA1 to the second adjacent cell CA2, or the second routing line RP2 may be a line for interconnecting patterns of a second metal layer, which is an upper layer above the first metal layer M1.

Figure 4:
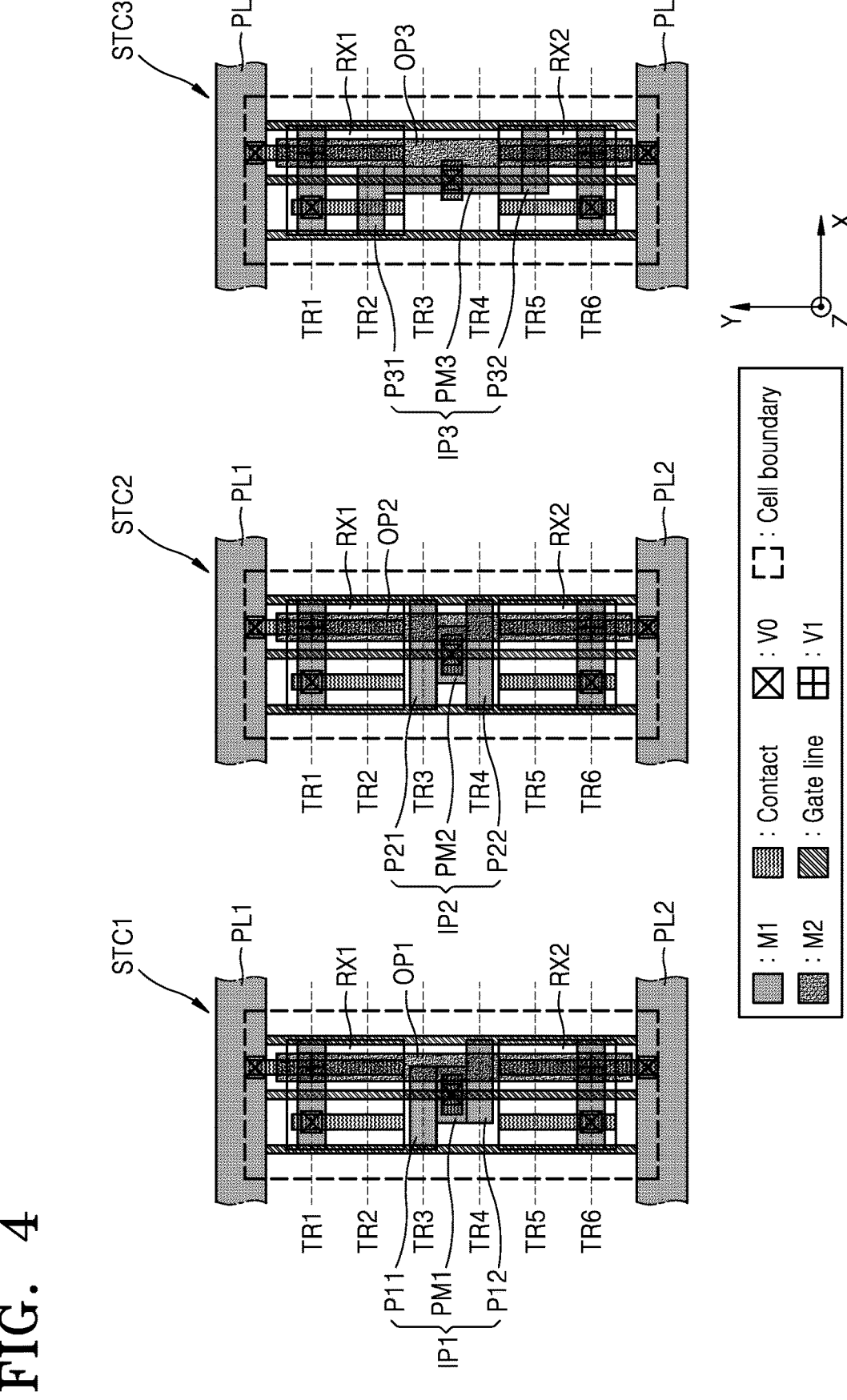
FIG. 4 is a plan view illustrating standard cells having various layouts, included in an integrated circuit according to an example embodiment.

FIG. 4 is a plan view illustrating standard cells having various layouts, included in an integrated circuit, according to an example embodiment.

Referring to FIG. 4, a first standard cell STC1, a second standard cell STC2, and a third standard cell STC3 are examples of the standard cell STC shown in FIG. 1, and are standard cells in which an inverter circuit is implemented. Each of the first to third standard cells STC1 to STC3 may be defined by a cell boundary, may include a first active region RX1 and a second active region RX2 extending in an X-axis direction, and may include gate lines extending in a Y-axis direction.

The first standard cell STC1 may include an input pin IP1 through which an input signal is received from the outside, and may include an output pin OP1 through which an output signal is output to the outside. The input pin IP1 of the first standard cell STC1 may be formed as a jog pattern of a first metal layer M1. The output pin OP1 of the first standard cell STC1 may be formed as a pattern of a second metal layer M2, and may be connected to the pattern of the first metal layer M1 thereunder through a second via V1.

The input pin IP1 of the first standard cell STC1 may include a first conductive pattern P11 and a second conductive pattern P12 respectively arranged on a plurality of tracks, and a connection pattern PM1 arranged off the plurality of tracks. For example, the input pin IP1 may include the first conductive pattern P11 arranged on a third track TR3, the second conductive pattern P12 arranged on a fourth track TR4, and the connection pattern PM1 in contact with the first conductive pattern P11 and the second conductive pattern P12, between the third track TR3 and the fourth track TR4. A contact and a first via V0 that connects a gate line to the connection pattern PM1 may be formed under the connection pattern PM1.

The input pin IP1 may be formed as a Z-shaped jog pattern on the first metal layer M1. For example, the first conductive pattern P11 may extend from the connection pattern PM1 in the −X-axis direction (i.e., a reverse direction of the X-axis direction), and the second conductive pattern P12 may extend from the connection pattern PM1 in the X-axis direction. According to another embodiment, for example, the first conductive pattern P11 may extend from the connection pattern PM1 in the X-axis direction, and the second conductive pattern P12 may extend from the connection pattern PM1 in the −X-axis direction.

The second standard cell STC2 may include an input pin IP2 through which an input signal is received from the outside, and may include an output pin OP2 through which an output signal is output to the outside. The input pin IP2 of the second standard cell STC2 may be formed as a jog pattern on a first metal layer M1.

The input pin IP2 of the second standard cell STC2 may include a first conductive pattern P21 and a second conductive pattern P22 respectively arranged on a plurality of tracks, and a connection pattern PM2 arranged off the plurality of tracks. For example, the input pin IP2 may include the first conductive pattern P21 arranged on a third track TR3, the second conductive pattern P22 arranged on a fourth track TR4, and the connection pattern PM2 in contact with the first conductive pattern P21 and the second conductive pattern P22, between the third track TR3 and the fourth track TR4. A contact and a first via V0 that connects a gate line to the connection pattern PM2 may be formed under the connection pattern PM2.

The input pin IP2 may be formed as a I-shaped jog pattern on the first metal layer M1. The connection pattern PM2 may be in contact with a middle portion of the first conductive pattern P21, and may be in contact with a middle portion of the second conductive pattern P22.

The third standard cell STC3 may include an input pin IP3 through which an input signal is received from the outside, and may include an output pin OP3 through which an output signal is output to the outside. The input pin IP3 of the third standard cell STC3 may be formed as a Z-shaped jog pattern on a first metal layer M1.

The input pin IP3 of the third standard cell STC3 may include a first conductive pattern P31 arranged on a second track TR2, a second conductive pattern P32 arranged on a fifth track TR5, and a connection pattern PM3 connected between the first conductive pattern P31 and the second conductive pattern P32. The connection pattern PM3 may be formed to extend in the Y-axis direction between the first conductive pattern P31 and the second conductive pattern P32. A contact and a first via V0 that connects a gate line to the connection pattern PM3 may be formed under the connection pattern PM3.

Figure 5:
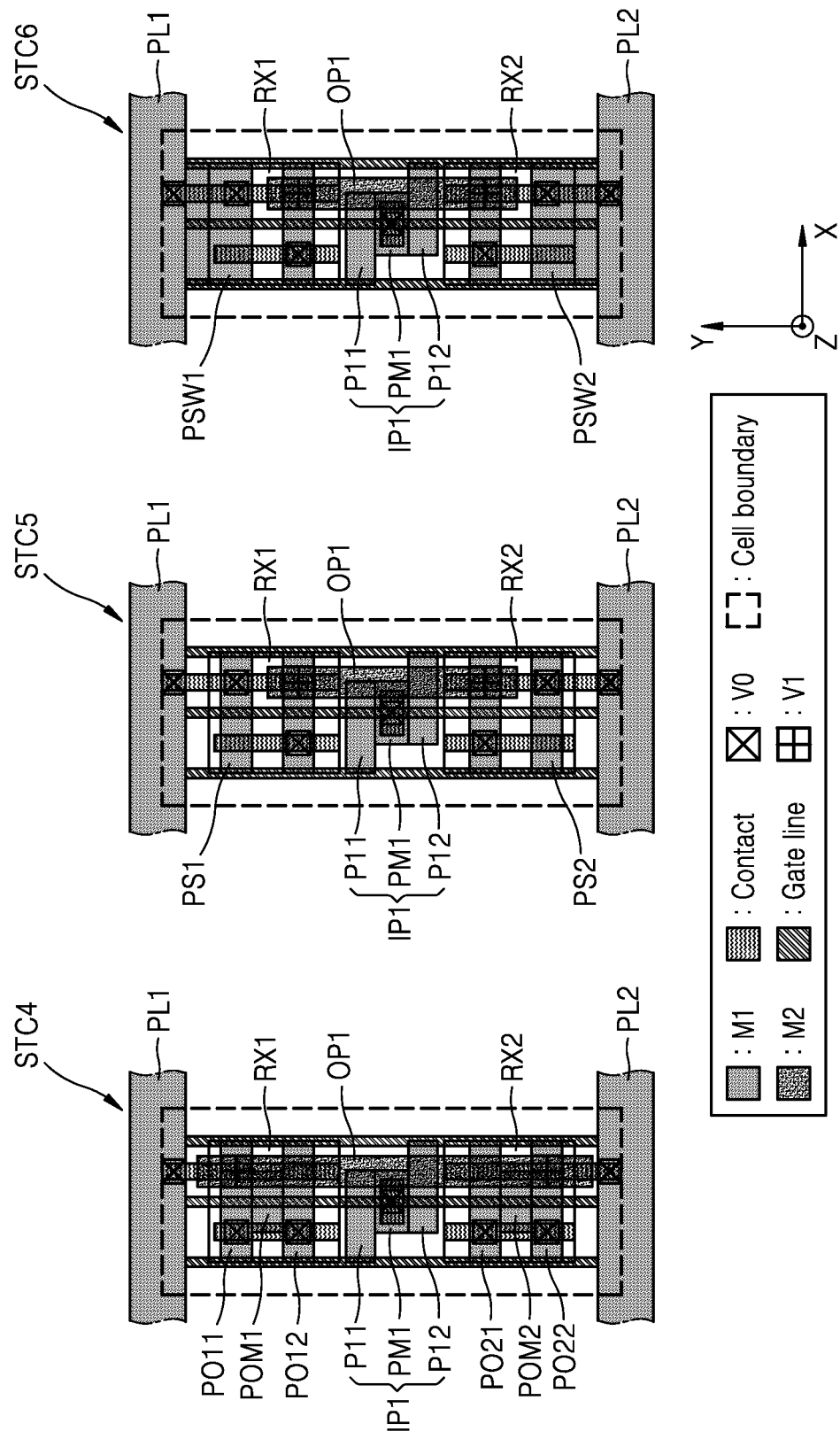
FIG. 5 is a plan view illustrating standard cells having various layouts, included in an integrated circuit according to an example embodiment.

FIG. 5 is a plan view illustrating standard cells having various layouts, included in an integrated circuit according to an example embodiment.

Referring to FIG. 5, a fourth standard cell STC4, a fifth standard cell STC5, and a sixth standard cell STC6 are examples of the standard cell STC shown in FIG. 1, and are standard cells in which an inverter circuit is implemented. Each of the fourth to sixth standard cells STC4 to STC6 may be defined by a cell boundary, may include a first active region RX1 and a second active region RX2 extending in an X-axis direction, and may include gate lines extending in a Y-axis direction.

Compared to the first standard cell STC1 of FIG. 4, the fourth standard cell STC4 may include a plurality of first vias V0 connected to drain regions of transistors formed in the first active region RX1 and the second active region RX2. The plurality of first vias V0 connected to the drain region of the first active region RX1 may be electrically connected to a first conductive pattern PO11, a second conductive pattern PO12, and a connection pattern POM1 connected between the first conductive pattern PO11 and the second conductive pattern PO12. The first conductive pattern PO11, the second conductive pattern PO12, and the connection pattern POM1 may be formed on a first metal layer M1. Here, the first conductive pattern PO11 and the second conductive pattern PO12 may be respectively formed on a plurality of tracks of the first metal layer M1.

The plurality of first vias V0 connected to the drain region of the second active region RX2 of the fourth standard cell STC4 may be electrically connected to a first conductive pattern PO21, a second conductive pattern PO22, and a connection pattern POM2 connected between the first conductive pattern P021 and the second conductive pattern P022. The first conductive pattern P021, the second conductive pattern P022, and the connection pattern POM2 may be formed on the first metal layer M1. Here, the first conductive pattern P021 and the second conductive pattern P022 may be respectively formed on a plurality of tracks of the first metal layer M1.

Compared to the first standard cell STC1 of FIG. 4, the fifth standard cell STC5 may include a plurality of first vias V0 connected to source regions of transistors formed in a first active region RX1 and a second active region RX2. The plurality of first vias V0 connected to the source region of the first active region RX1 may be electrically connected to a first power line PL1, and a conductive pattern PS1 of a first metal layer M1. The plurality of first vias V0 connected to the source region of the second active region RX2 may be electrically connected to a second power line PL2, and a conductive pattern PS2 of the first metal layer M1. Here, the conductive patterns PS1 and PS2 may be respectively formed on a plurality of tracks of the first metal layer M1.

Compared to the fifth standard cell STC5, in the sixth standard cell STC6, a conductive pattern PSW1 connected to a source region of the first active region RX1 via a contact and first vias V0 may be formed to be relatively wide. For example, the conductive pattern PSW1 connected to a via formed on the source region of the first active region RX1 may be formed to be in contact with the first power line PL1.

In addition, compared to the fifth standard cell STC5, in the sixth standard cell STC6, a conductive pattern PSW2 connected to a source region of the second active region RX2 via a contact and the first vias V0 may be formed to be relatively wide. For example, the conductive pattern PSW2 connected to a via formed on the source region of the second active region RX2 may be formed to be in contact with the second power line PL2.

Figure 6:
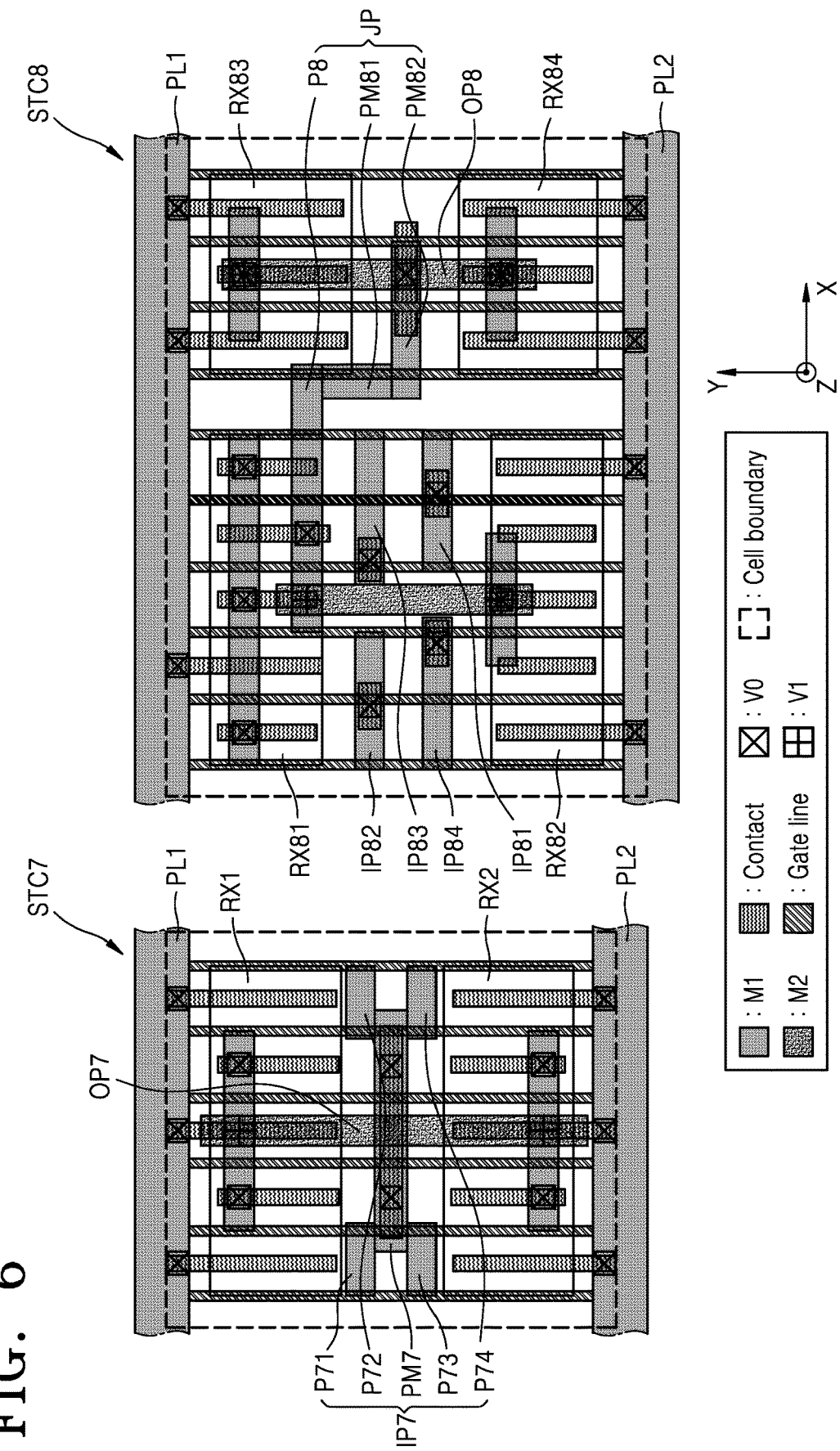
FIG. 6 is a plan view illustrating standard cells having various layouts, included in an integrated circuit according to an example embodiment.

FIG. 6 is a plan view illustrating standard cells having various layouts, included in an integrated circuit, according to an example embodiment.

Referring to FIG. 6, a seventh standard cell STC7 and an eighth standard cell STC8 are examples of the standard cell STC shown in FIG. 1, the seventh standard cell STC7 is a standard cell in which an inverter circuit is implemented, and the eighth standard cell STC8 is a standard cell in which an AND-OR (AO22) circuit is implemented.

The seventh standard cell STC7 may be defined by a cell boundary, may include a first active region RX1 and a second active region RX2 extending in an X-axis direction, and may include gate lines extending in a Y-axis direction. In an example embodiment, four fins may be formed in each of the first active region RX1 and the second active region RX2.

The seventh standard cell STC7 may include an input pin IP7 formed on a first metal layer M1, and may include an output pin OP7 formed on a second metal layer M2. The input pin IP7 of the seventh standard cell STC7 may include conductive patterns P71, P72, P73, and P74 respectively arranged on a plurality of tracks, and a connection pattern PM7 arranged off the plurality of tracks. In an example embodiment, in the input pin IP7, portions (e.g., the conductive patterns P71, P72, P73, and P74) close to the cell boundary may be formed as on-track patterns arranged on the plurality of tracks.

The connection pattern PM7 may be in contact with the conductive patterns P71, P72, P73, and P74, and may electrically connect the conductive patterns P71, P72, P73, and P74 to one another. A contact and a first via V0 that connects a gate line to the connection pattern PM7 may be formed under the connection pattern PM7.

The eighth standard cell STC8 may be defined by a cell boundary, and may include a first active region RX81, a second active region RX82, a third active region RX83, and a fourth active region RX84 extending in the X-axis direction, and may include gate lines extending in the Y-axis direction. P-type transistors may be formed in the first active region RX81 and the third active region RX83, and N-type transistors may be formed in the second active region RX82 and the fourth active region RX84. In an example embodiment, the numbers of fins respectively formed in the first active region RX81 and the third active region RX83 may be different from each other, and the numbers of fins respectively formed in the second active region RX82 and the fourth active region RX84 may be different from each other. For example, four fins may be formed in each of the first active region RX81 and the second active region RX82, and three fins may be formed in each of the third active region RX83 and the fourth active region RX84.

The eighth standard cell STC8 may include a first input pin IP81, a second input pin IP82, a third input pin IP83, and a fourth input pin IP84 formed on a first metal layer M1, and may include an output pin OP8 formed on a second metal layer M2. In addition, the eighth standard cell STC8 may include a jog pattern JP for an internal connection formed on the first metal layer M1.

The jog pattern JP may include a conductive pattern P8 arranged on a track, and a first connection pattern PM81 and a second connection pattern PM82 arranged off the track. The conductive pattern P8 and the second connection pattern PM82 may extend in the X-axis direction, and the first connection pattern PM81 may extend in the Y-axis direction to connect the conductive pattern P8 and the second connection pattern PM82 to each other. A contact and a first via V0 that connects a gate line to the second connection pattern PM82 may be formed under the second connection pattern PM82.

Figure 7:
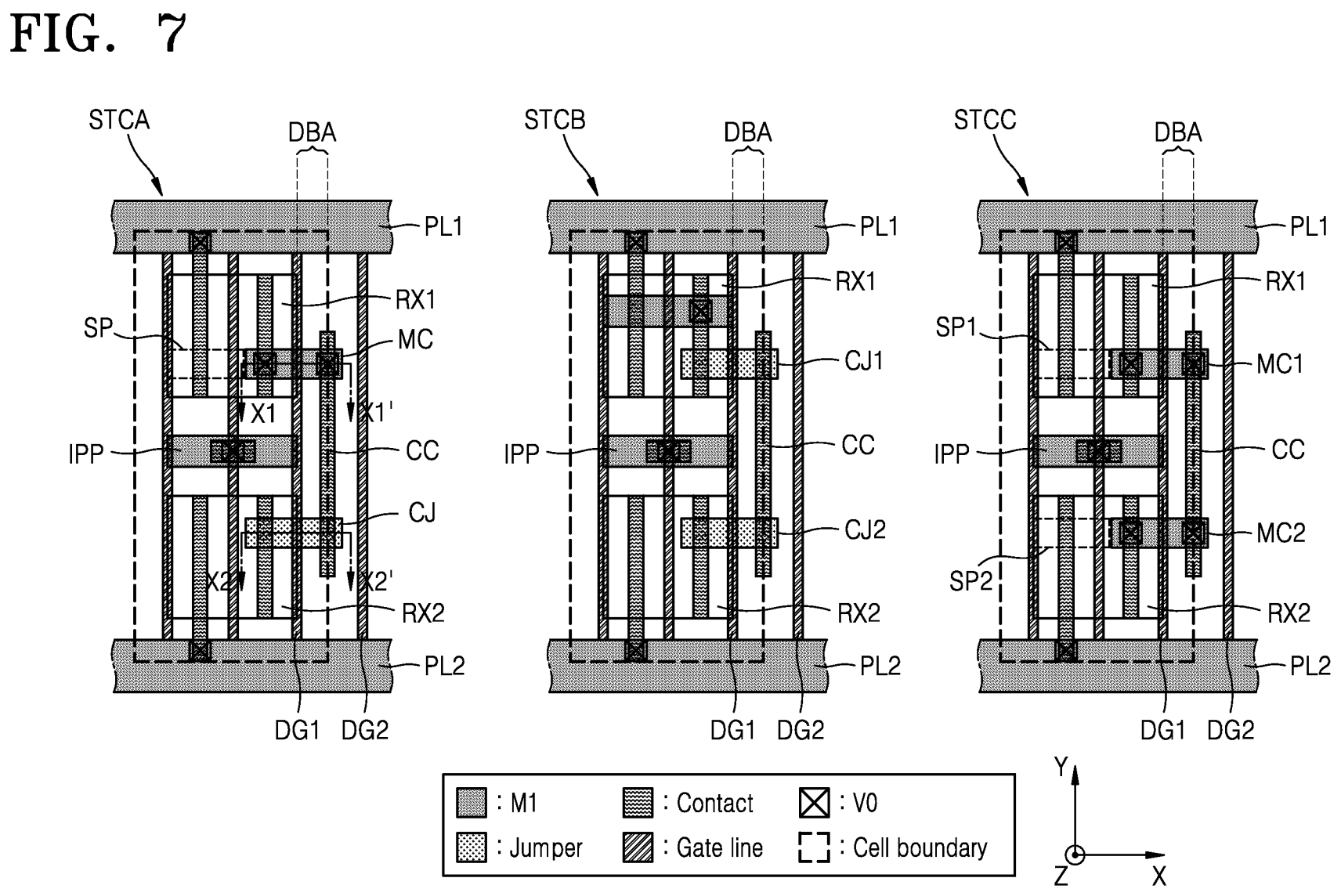

FIG. 7 is a plan view illustrating standard cells having various layouts, included in an integrated circuit, according to an example embodiment.

Referring to FIG. 7, at least one of a first standard cell STCA, a second standard cell STCB, and a third standard cell STCC may be arranged in an integrated circuit. The first to third standard cells STCA to STCC are standard cells in which an inverter circuit is implemented. Each of the first to third standard cells STCA to STCC may be defined by a cell boundary, may include a first active region RX1 and a second active region RX2 extending in an X-axis direction, and may include gate lines extending in a Y-axis direction.

The first to third standard cells STCA to STCC may each include an input pin IPP formed on a first metal layer M1. In an example embodiment, the input pin IPP may be formed as a conductive pattern arranged on a track. According to another embodiment, as described above with reference to FIG. 1 and the like, the input pin IPP may be formed as a jog pattern including a conductive pattern arranged off the track.

A cutting layer may be arranged at the cell boundary of each of the first to third standard cells STCA to STCC, such that each of the first to third standard cells STCA to STCC is electrically insulated from an adjacent cell. The cutting layer may include an insulating material to cut active regions between standard cells, and accordingly, the first to third standard cells STCA to STCC may be electrically insulated from the adjacent cells. The cutting layer may be a double diffusion break (DDB) or a single diffusion break (SDB).

Double diffusion breaks (DDBs) may be formed at the cell boundaries in the X-axis direction of the first to third standard cells STCA to STCC. Double diffusion breaks (DDBs) or single diffusion breaks (SDBs) may be formed at the cell boundaries in a −X-axis direction of the first to third standard cells STCA to STCC.

The first to third standard cells STCA to STCC may each include a boundary area DBA adjacent to the cell boundary in the X-axis direction. A first dummy gate line DG1 may be arranged in the boundary area DBA, and a second dummy gate line DG2 may be arranged in an adjacent cell adjacent to each of the first to third standard cells STCA to STCC in the X-axis direction. A cutting layer may be formed in the boundary area DBA, and the cutting layer may be formed between the first dummy gate line DG1 and the second dummy gate line DG2. The first dummy gate line DG1 and the second dummy gate line DG2 may be formed as lines which are not substantially formed in an integrated circuit or do not operate as gate lines of a transistor.

A connection contact CC extending in the Y-axis direction may be arranged in the boundary area DBA of the first standard cell STCA. The connection contact CC of the first standard cell STCA may be arranged on the cell boundary of the first standard cell STCA, and may be arranged between the first dummy gate line DG1 and the second dummy gate line DG2. In an example embodiment, the connection contact CC may be formed on one cell boundary selected from the cell boundary in the −X-axis direction of the first standard cell STCA and the cell boundary in the X-axis direction of the first standard cell STCA.

In an example embodiment, the connection contact CC of the first standard cell STCA may be formed at the same height from a substrate as contacts formed in the first active region RX1 and the second active region RX2. The connection contact CC of the first standard cell STCA may be connected to the contact formed in the first active region RX1 via a connection metal line MC, and may be connected to the contact formed in the second active region RX2 via a jumper CJ.

The connection metal line MC may be formed as a pattern of a first metal layer M1, and may be arranged on a track. The connection metal line MC may extend off the cell boundary of the first standard cell STCA.

In the first standard cell STCA, a separation space SP may be defined in the −X axis direction of the connection metal line MC in the track on which the connection metal line MC is arranged. The pattern of the first metal layer M1 may not be formed in the separation space SP, and, even when an adjacent cell including the connection metal line MC, such as the first standard cell STCA, is adjacently arranged in the −X-axis direction of the first standard cell STCA, a routing space may be secured and formed.

A connection contact CC extending in the Y-axis direction may be arranged in the boundary area DBA of the second standard cell STCB, and the connection contact CC may be arranged on the cell boundary of the second standard cell STCB. In an example embodiment, the connection contact CC may be formed on one cell boundary selected from the cell boundary in the −X-axis direction and the cell boundary in the X-axis direction of the second standard cell STCB. The connection contact CC of the second standard cell STCB may be connected to a contact formed in the first active region RX1 via a first jumper CJ1, and may be connected to a contact formed in the second active region RX2 via a second jumper CJ2.

A connection contact CC extending in the Y-axis direction may be arranged in the boundary area DBA of the third standard cell STCC, and the connection contact CC may be arranged on the cell boundary of the third standard cell STCC. In an example embodiment, the connection contact CC may be formed on one cell boundary selected from the cell boundary in the −X-axis direction and the cell boundary in the X-axis direction of the third standard cell STCC. The connection contact CC of the third standard cell STCC may be connected to a contact formed in the first active region RX1 via a first connection metal line MC1, and may be connected to a contact formed in the second active region RX2 via a second connection metal line MC2.

Each of the first connection metal line MC1 and the second connection metal line MC2 may be formed as a pattern of the first metal layer M1, and may be arranged on a track. The first connection metal line MC1 and the second connection metal line MC2 may each extend off the cell boundary.

In the third standard cell STCC, a first separation space SP1 may be formed in the −X-axis direction of the first connection metal line MC1 in the track on which the first connection metal line MC1 is arranged, and a second separation space SP2 may be formed in the −X-axis direction of the second connection metal line MC2 in the track on which the second connection metal line MC2 is arranged. The pattern of the first metal layer M1 may not be formed in the first separation space SP1 and the second separation space SP2, and, even when an adjacent cell including at least one of the first connection metal line MC1 and the second connection metal line MC2, such as the third standard cell STCC, is adjacently arranged in the −X-axis direction of the third standard cell STCC, a routing space may be secured.

The first to third standard cells STCA to STCC according to the embodiment may include the connection contacts CC formed in the boundary areas DBA to connect cell internal elements to each other, and thus may not include conductive patterns of second metal layers formed on the first metal layers M1 and extending in the Y-axis direction. Accordingly, when fabricating an integrated circuit including at least one of the first to third standard cells STCA to STCC, the use of upper metal layers, e.g., second metal layers, for respectively interconnecting the first to third standard cells STCA to STCC and other standard cells may be facilitated.

Figure 8:
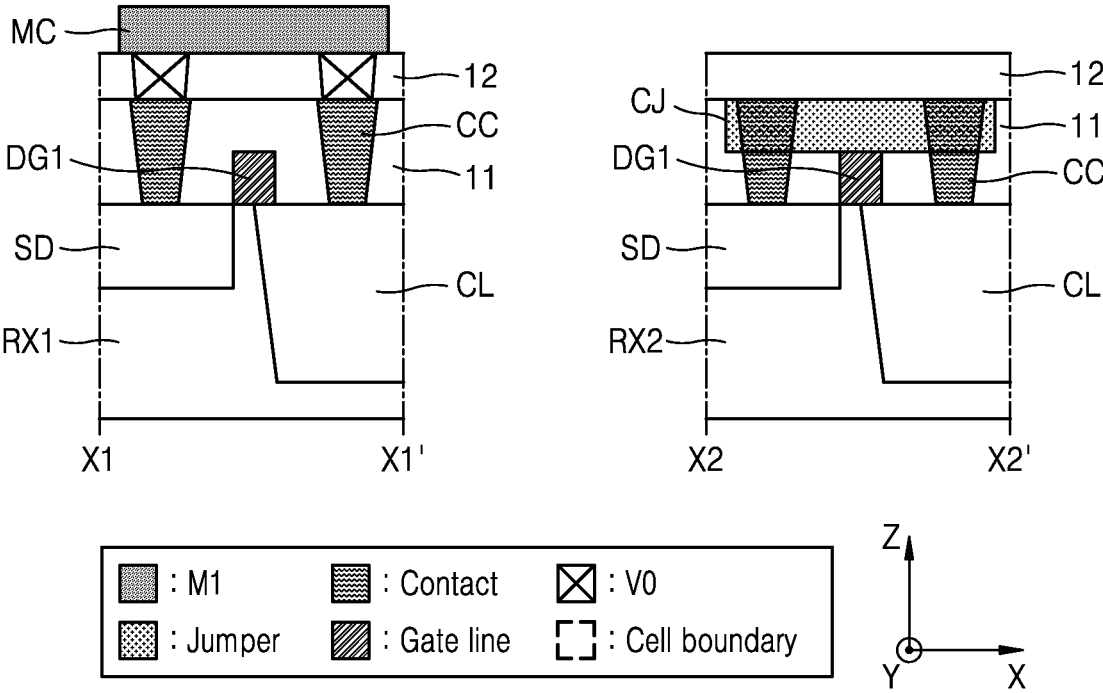
FIG. 8 is a cross-sectional view taken along each of lines X1-X1' and X2-X2' of FIG. 7.

FIG. 8 is a cross-sectional view taken along each of lines X1-X1' and X2-X2' of FIG. 7.

Referring to FIGS. 7 and 8, a cutting layer CL including an insulating material may be formed in the boundary area DBA of the first standard cell STCA. The cutting layer CL may be a double diffusion break (DDB) which cuts the first active region RX1 of the first standard cell STCA and an active region of an adjacent cell, and cuts the second active region RX2 of the first standard cell STCA and an active region of the adjacent cell.

The first active region RX1 and the second active region RX2 may be formed on a substrate. In an example embodiment, the second active region RX2 may be formed on a substrate doped with P-type impurities, and the first active region RX1 may be formed in an N well formed within the substrate. A source/drain region SD may be formed in each of the first active region RX1 and the second active region RX2.

A first interlayer insulating layer 11 and a second interlayer insulating layer 12 may be formed on the source/drain region SD. A contact (e.g., an active contact) may be formed to be in contact with the source/drain region SD, and to connect the source/drain region SD to the connection metal line MC by passing through the first interlayer insulating layer 11. In addition, the connection contact CC may be formed by passing through the first interlayer insulating layer 11.

By passing through the second interlayer insulating layer 12, the first via V0 connecting the active contact to the connection metal line MC may be formed, and the first via V0 connecting the connection contact CC to the connection metal line MC may be formed. The connection metal line MC may be formed on the first vias V0.

In an example embodiment, the jumper CJ may be formed at the same height as the contact (e.g., the gate contact) formed on the gate line, and may be in contact with the active contact and the connection contact MC in parallel in the X-axis direction. For example, the jumper CJ may be formed by passing through a portion of the first interlayer insulating layer 11. However, embodiments are not limited thereto, and the jumper CJ may also be formed on the active contact and the connection contact CC to be in contact with the active contact and the connection contact CC.

Figure 9:
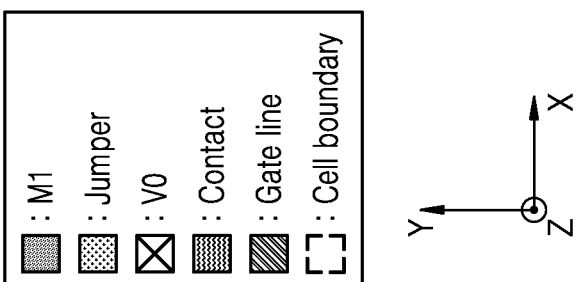
FIG. 9 is a plan view illustrating standard cells having various layouts, included in an integrated circuit according to an example embodiment.
Figure 9:
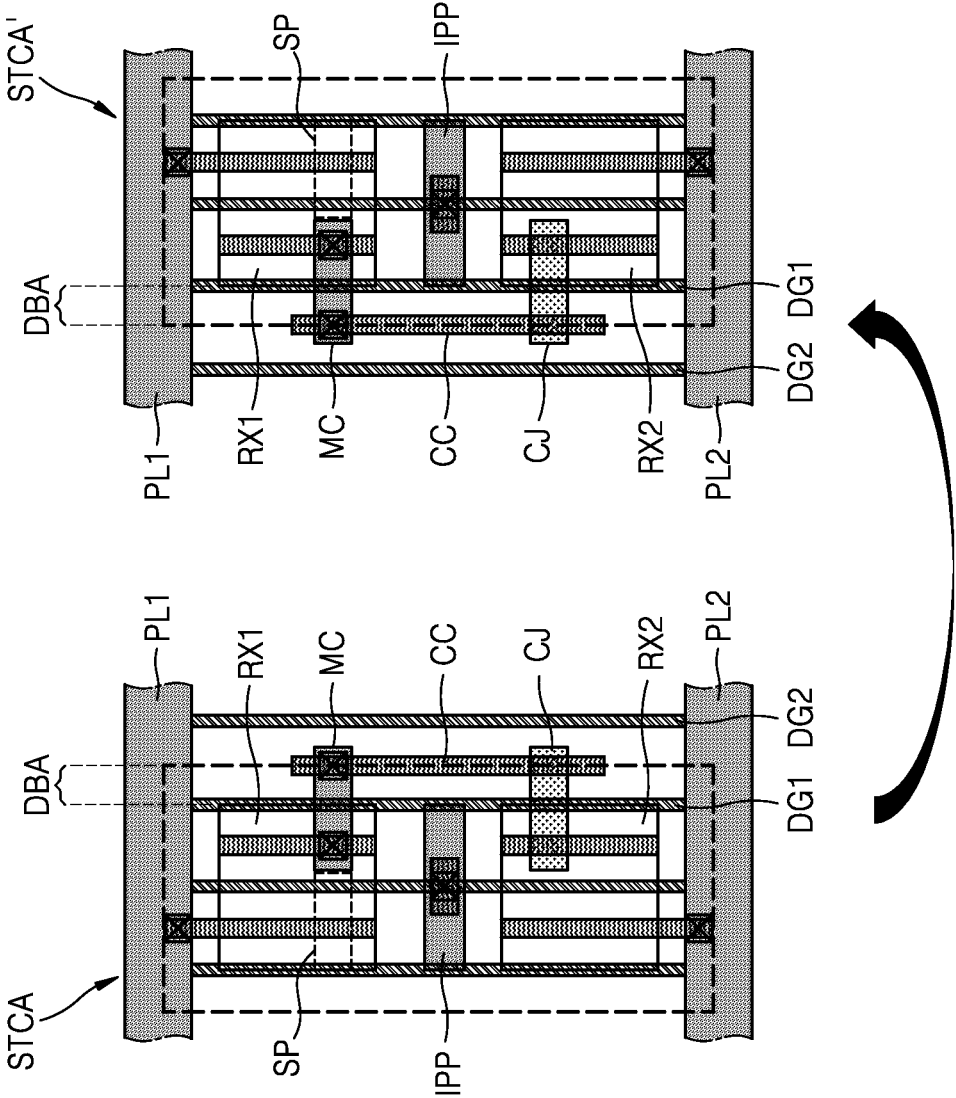

FIG. 9 is a plan view illustrating standard cells having various layouts, included in an integrated circuit, according to an example embodiment.

Referring to FIG. 9, a standard cell STCA' may be arranged in an integrated circuit. The standard cell STCA' may have a structure in which a gate line, a first active region RX1, a second active region RX2, a contact, a first via V0, a jumper CJ, a separation space SP, and a pattern of a first metal layer M1 are respectively symmetrical in a Y-axis direction with respect to the gate line, the first active region RX1, the second active region RX2, the contact, the first via V0, the jumper CJ, the separation space SP, and the pattern of the first metal layer M1 of the first standard cell STCA described above with reference to FIG. 7. In an example embodiment, the first standard cell STCA and the standard cell STCA' may have a structure in which patterns of upper layers of the first metal layers M1, e.g., second metal layers, are symmetrical to each other in the Y-axis direction, or may have a structure in which the patterns of the upper layers of the first metal layers M1 are not symmetrical to each other.

In the integrated circuit according to the embodiment, the first standard cell STCA and/or the standard cell STCA' may be arranged by considering ease of the formation of an interconnection (i.e., routing) with an adjacent cell. In addition, in the integrated circuit, a standard cell to which the second standard cell STCB of FIG. 7 is symmetrical in the Y-axis direction may be arranged, or a standard cell to which the third standard cell STCC of FIG. 7 is symmetrical in the Y-axis direction may be arranged.

Figure 10:
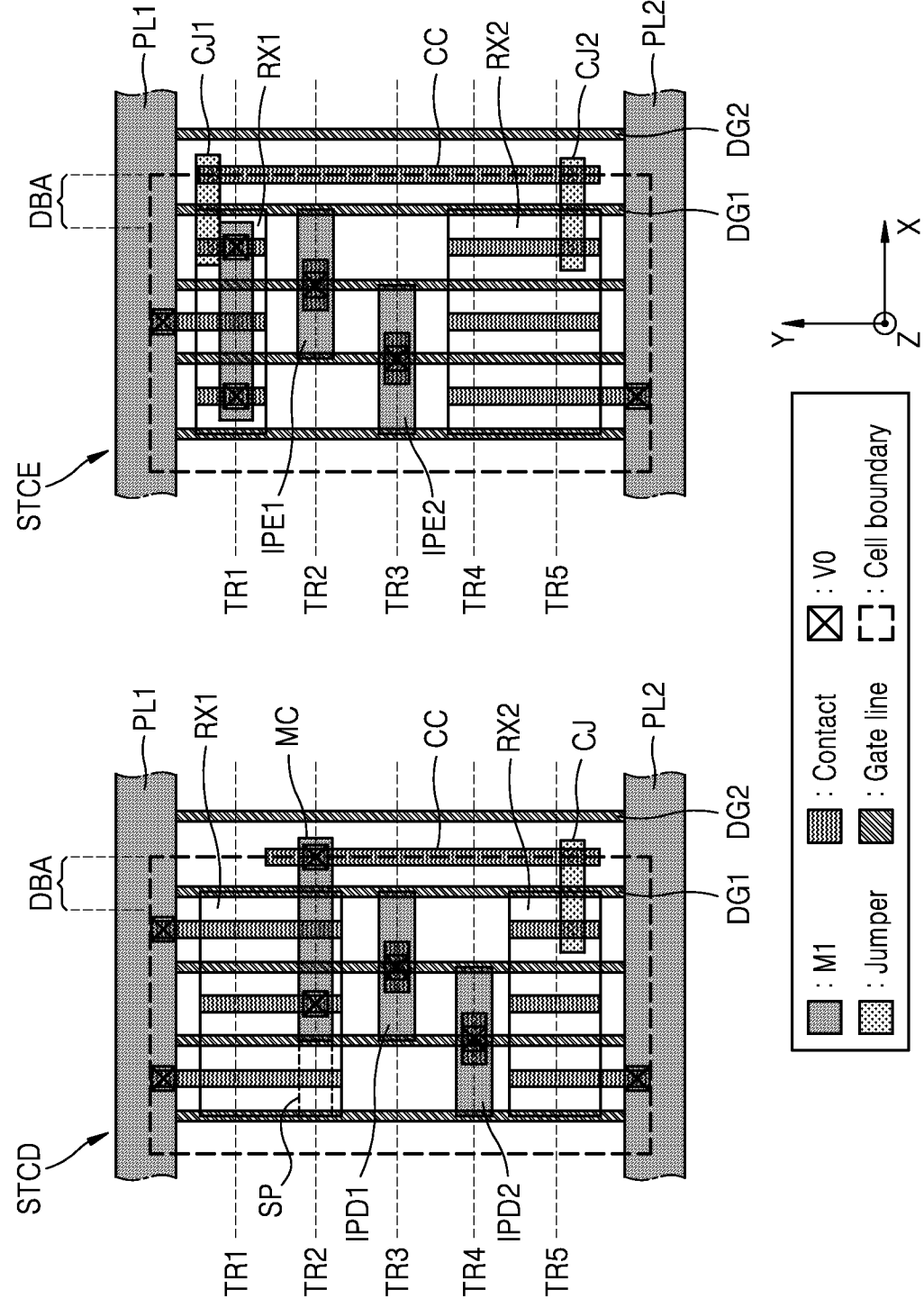
FIG. 10 is a plan view illustrating standard cells having various layouts, included in an integrated circuit, according to an example embodiment.

FIG. 10 is a plan view illustrating standard cells having various layouts, included in an integrated circuit, according to an example embodiment.

Referring to FIG. 10, a fourth standard cell STCD and a fifth standard cell STCE are standard cells in which NAND gates are implemented. Each of the fourth standard cell STCD and the fifth standard cell STCE may be defined by a cell boundary, may include a first active region RX1 and a second active region RX2 extending in an X-axis direction, and may include gate lines extending in a Y-axis direction. A plurality of tracks, e.g., a first track TR1, a second track TR2, a third track TR3, a fourth track TR4, and a fifth track TR5, may be formed in each of the fourth standard cell STCD and the fifth standard cell STCE, but the fourth standard cell STCD and the fifth standard cell STCE are not limited thereto. The number of tracks of a first metal layer M1 formed in each of the fourth standard cell STCD and the fifth standard cell STCE may be variously modified.

The fourth standard cell STCD may include a first input pin IPD1 and a second input pin IPD2 formed on the first metal layer M1, and the fifth standard cell STCE may include a first input pin IPE1 and a second input pin IPE2 formed on the first metal layer M1. For example, the first input pin IPD1 of the fourth standard cell STCD may be formed on the third track TR3, and the second input pin IPD2 of the fourth standard cell STCD may be formed on the fourth track TR4. For example, the first input pin IPE1 of the fifth standard cell STCE may be formed on the second track TR2, and the second input pin IPE2 of the fifth standard cell STCE may be formed on the third track TR3. However, embodiments are not limited thereto, and the first input pin IPD1 and the second input pin IPD2 of the fourth standard cell STCD may be formed as jog patterns including conductive patterns arranged off the tracks, and the first input pin IPE1 and the second input pin IPE2 of the fifth standard cell STCE may be formed as jog patterns including conductive patterns arranged off the tracks.

A connection contact CC extending in the Y-axis direction may be arranged in a boundary area DBA of the fourth standard cell STCD. The connection contact CC of the fourth standard cell STCD may be connected, via a connection metal line MC, to a contact formed in the first active region RX1, and may be connected, via a jumper CJ, to a contact formed in the second active region RX2. A separation space SP may be defined in a −X-axis direction of the connection metal line MC in the track on which the connection metal line MC is arranged.

A connection contact CC extending in the Y-axis direction may be arranged in a boundary area DBA of the fifth standard cell STCE. The connection contact CC of the fifth standard cell STCE may be connected, via a first jumper CJ1, to a contact formed in the first active region RX1, and may be connected, via a second jumper CJ2, to a contact formed in the second active region RX2.

Figure 11A:
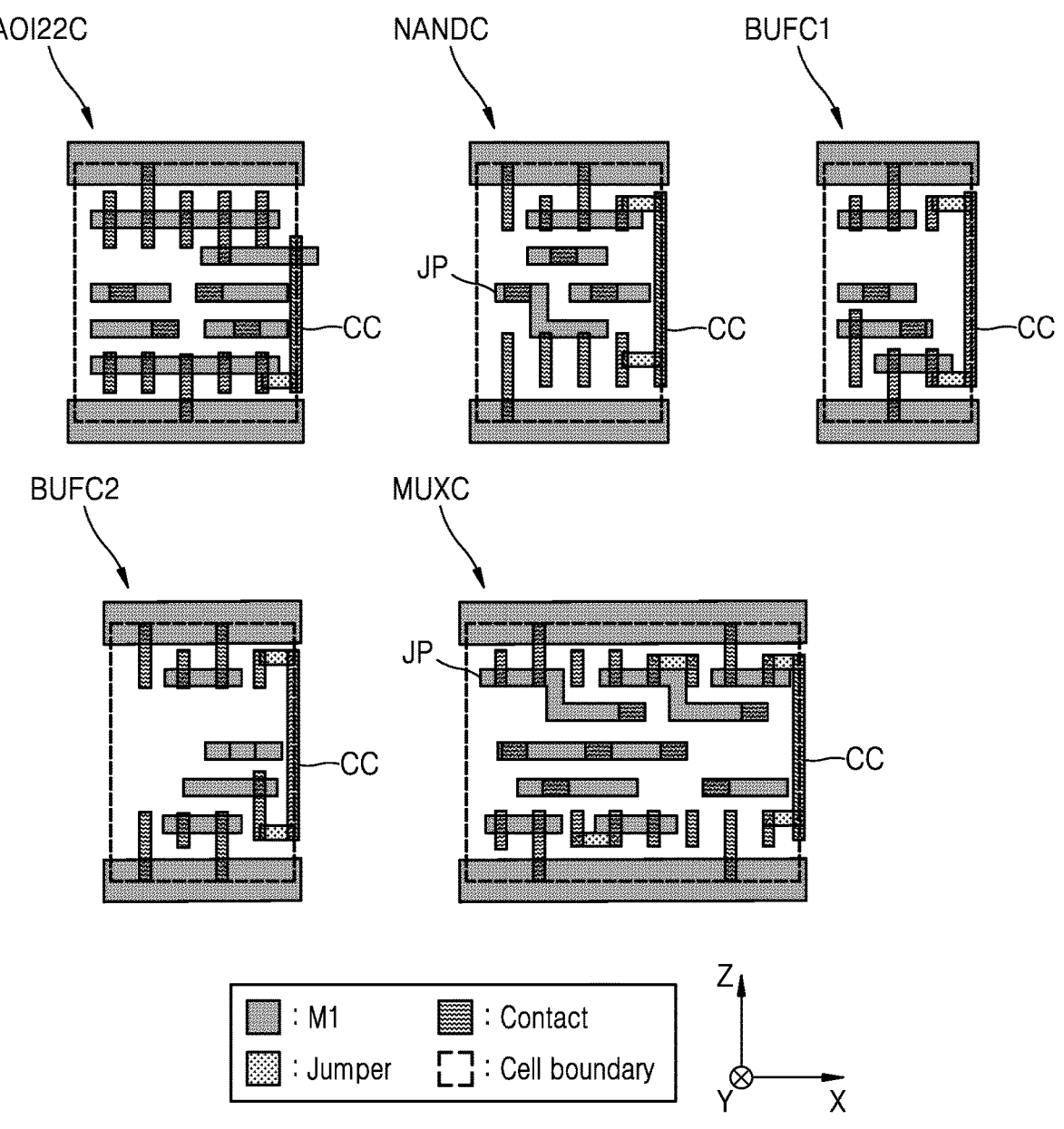
FIGS. 11A and 11B are plan views illustrating standard cells having various layouts, included in an integrated circuit, according to example embodiments.
Figure 11B:
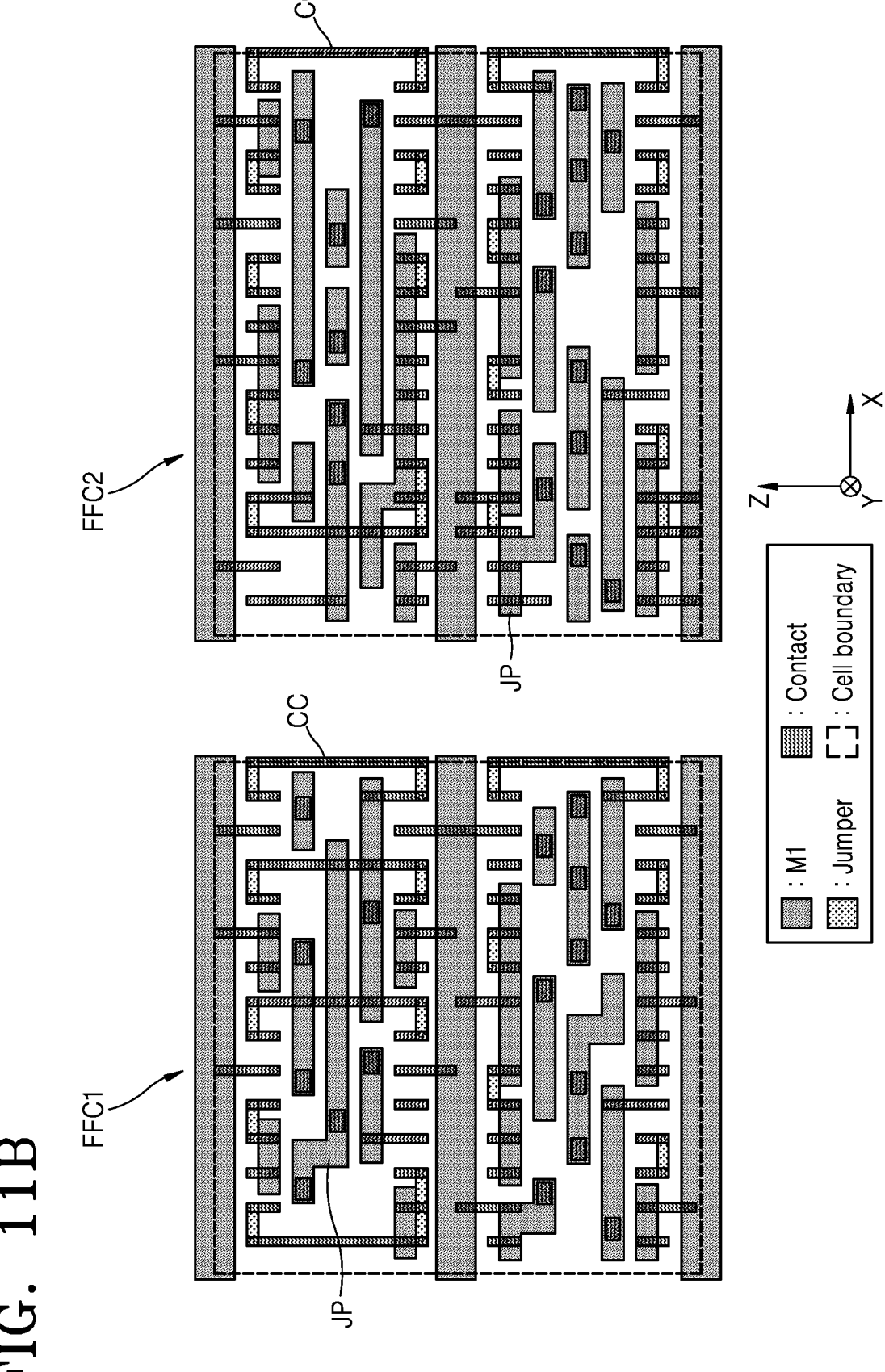

FIGS. 11A and 11B are plan views illustrating standard cells having various layouts, included in an integrated circuit, according to example embodiments. FIGS. 11A and 11B illustrate a contact, a jumper, and a pattern of a first metal layer M1 formed in each of standard cells.

Referring to FIGS. 11A and 11B, various types of standard cells in which a connection contact CC is formed on a cell boundary may be included in an integrated circuit. For example, at least one of a standard cell AOI22C in which an AND-OR-inverter (AOI22) circuit is implemented, a standard cell NANDC in which a NAND gate circuit is implemented, standard cells BUFC1 and BUFC2 in which buffer circuits are implemented, a standard cell MUXC in which a multiplexer is implemented, and standard cells FFC1 and FFC2 in which flip-flop circuits are implemented may be included in an integrated circuit.

At least one of the standard cells AOI22C, NANDC, BUFC1, BUFC2, MUXC, FFC1, and FFC2 shown in FIGS. 11A and 11B may include a jog pattern JP formed on a first metal layer M1. A gate contact connecting the jog pattern JP to a gate line may be in contact with a lower portion of the jog pattern JP, and the jog pattern JP may include a conductive pattern arranged off a track. A standard cell according an embodiment may be a single-height cell arranged in only one row, such as the standard cells AOI22C, NANDC, BUFC1, BUFC2, and MUXC shown in FIG. 11A, or may be a multi-height cell arranged in a plurality of rows, like the standard cells FFC1 and FFC2 shown in FIG. 11B.

Figure 12:
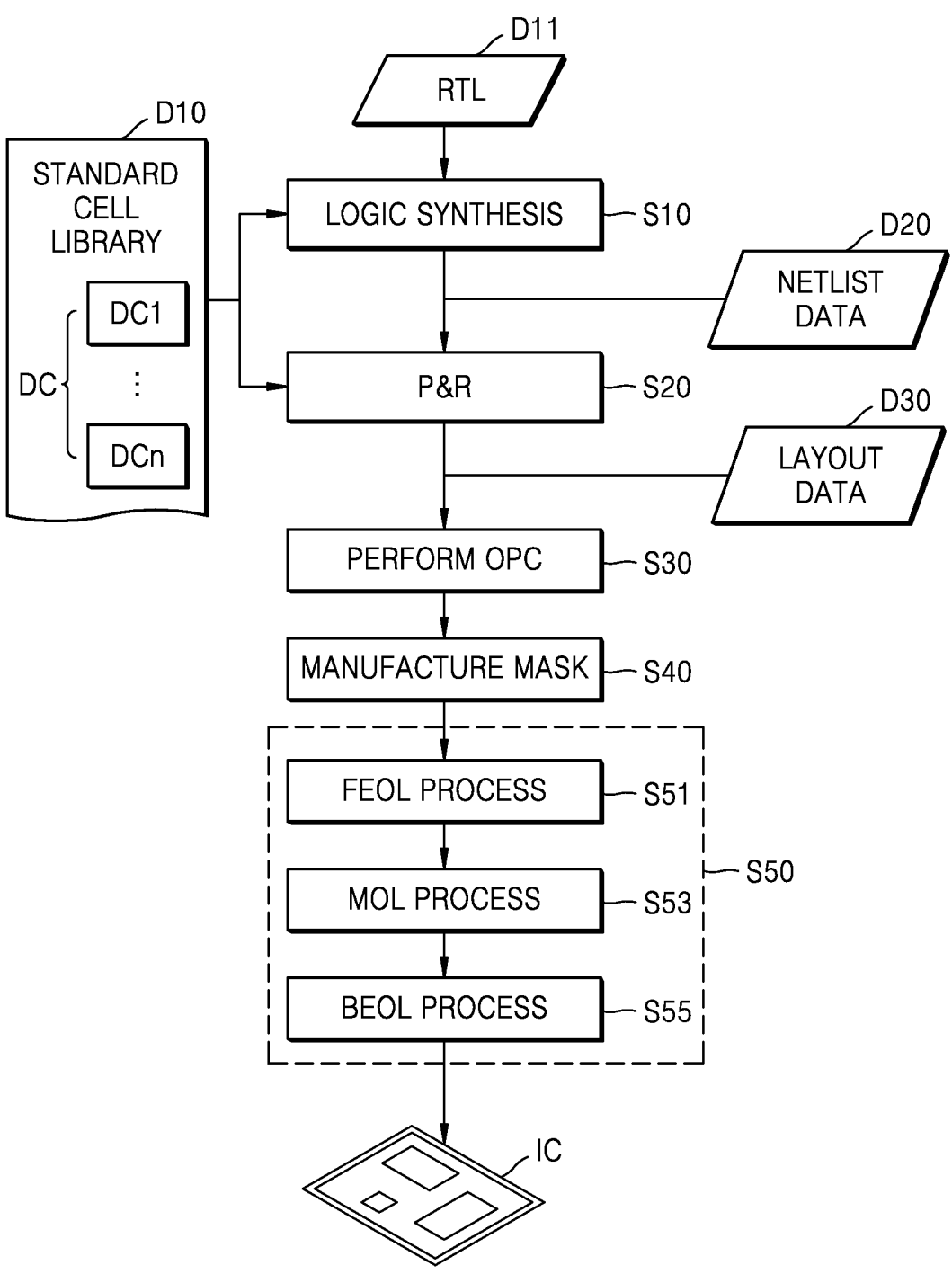
FIG. 12 is a flowchart illustrating a method of fabricating an integrated circuit according to an example embodiment.

FIG. 12 is a flowchart illustrating a method of fabricating an integrated circuit, according to an example embodiment.

Referring to FIG. 12, a standard cell library D10 may include information about standard cells, e.g., function information, characteristic information, layout information, and the like. The standard cell library D10 may include data DC defining a layout of a standard cell. The data DC may include data defining structures of standard cells which perform the same function and have different layouts. The data DC may include data defining structures of standard cells as described above with reference to FIGS. 1 to 11B. The data DC may include first data DC1 defining structures of standard cells which perform a first function and have different layouts, and n$^{th}$ data DCn (where n is a natural number greater than or equal to 2) defining structures of standard cells which perform an n$^{th}$ function and have different layouts.

For example, the first data DC1 may include data defining structures of standard cells which perform a first function and include input pins formed as jog patterns, and the first data DC1 may include data defining structures of standard cells which perform a first function and include connection contacts formed on cell boundaries.

Operations S10 and S20 are operations of designing an integrated circuit IC, in which layout data D30 may be generated from RTL data D11. In operation S10, a logic synthesis operation of generating netlist data D20 from the RTL data D11 may be performed. For example, a semiconductor design tool (e.g., a logic synthesis module) may generate the netlist data D20 including a bitstream or a netlist from the RTL data D11 written in a VHSIC hardware description language (VHDL), and a hardware description language (HDL) such as Verilog, by performing logic synthesis with reference to the standard cell library D10. The standard cell library D10 may include the data DC defining structures of standard cells which perform the same function and have different layouts, and the standard cells may be included in the integrated circuit IC by referring to the data DC in a logic synthesis process.

In operation S20, a place and routing (P&R) operation of generating the layout data D30 from the netlist data D20 may be performed. The layout data D30 may have, for example, a format such as GDSII, and may include geometric information of standard cells and interconnections.

For example, a semiconductor design tool (e.g., a P&R module) may arrange a plurality of standard cells by referring to the standard cell library D10 from the netlist data D20. The semiconductor design tool may select one of layouts of a standard cell defined by the netlist data D20 by referring to the data DC, and may arrange the selected layout of the standard cell. For example, operation S20 may include operations S21 and S23 of FIG. 13, or may include operations S21' and S23' of FIG. 14.

In operation S20, an operation of generating interconnections may be further performed. An interconnection may electrically connect an output pin and an input pin of a standard cell to another standard cell. For example, an interconnection may include a plurality of vias and a conductive pattern formed on at least one metal layer. In an example embodiment, routing lines and vias formed when standard cells as described above with reference to FIGS. 1 to 11B are connected to other standard cells (adjacent cells) may be generated.

In operation S30, optical proximity correction (OPC) may be performed. The OPC may be referred to as an operation for forming a pattern having a desired shape by correcting distortion such as refraction due to characteristics of light in photolithography included in a semiconductor process for fabricating the integrated circuit IC, and a pattern on a mask may be determined by applying the OPC to the layout data D30. In an example embodiment, a layout of the integrated circuit IC may be limitedly modified in operation S30, and the limited modification of the layout of the integrated circuit IC in operation S30 may be post-processing for forming a structure of the integrated circuit IC most suitable and may be referred to as design polishing.

In operation S40, an operation of manufacturing a mask may be performed. For example, as the OPC is applied to the layout data D30, patterns on a mask may be defined to form patterns on a plurality of layers, and at least one mask (or photomask) for forming the patterns on each of the plurality of layers may be manufactured.

In operation S50, an operation of fabricating the integrated circuit IC may be performed. For example, the integrated circuit IC may be fabricated by patterning the plurality of layers by using the at least one mask manufactured in operation S40. Operation S50 may include operations S51, S53, and S55.

In operation S51, a front-end-of-line (FEOL) process may be performed. The FEOL process may be referred to as a process of forming individual elements, e.g., a transistor, a capacitor, a resistor, and the like, on a substrate in the process of fabricating the integrated circuit IC. For example, the FEOL process may include an operation of planarizing and cleaning a wafer, an operation of forming a trench, an operation of forming a well, an operation of forming a gate line, an operation of forming source and drain regions, and the like.

In operation S53, a middle-of-line (MOL) process may be performed. The MOL process may be referred to as a process of forming a connection member that connects, within a standard cell, the individual elements generated via the FEOL process. For example, the MOL process may include an operation of forming an active contact in an active region, an operation of forming a gate contact on a gate line, an operation of forming a via on the active contact and the gate line, an operation of forming a jumper connecting different active contacts, and the like.

In operation S55, a back-end-of-line (BEOL) process may be performed. The BEOL process may be referred to as a process of interconnecting the individual elements, e.g., the transistor, the capacitor, the resistor, and the like, in the process of fabricating the integrated circuit IC. For example, the BEOL process may include an operation of silicidating a gate, and source and drain regions, an operation of adding a dielectric, a planarization operation, an operation of forming a hole, an operation of forming metal layers, an operation of forming a via between the metal layers, an operation of forming a passivation layer, and the like. Thereafter, the integrated circuit IC may be packaged in a semiconductor package, and may be used as a component in various types of applications.

Figure 13:
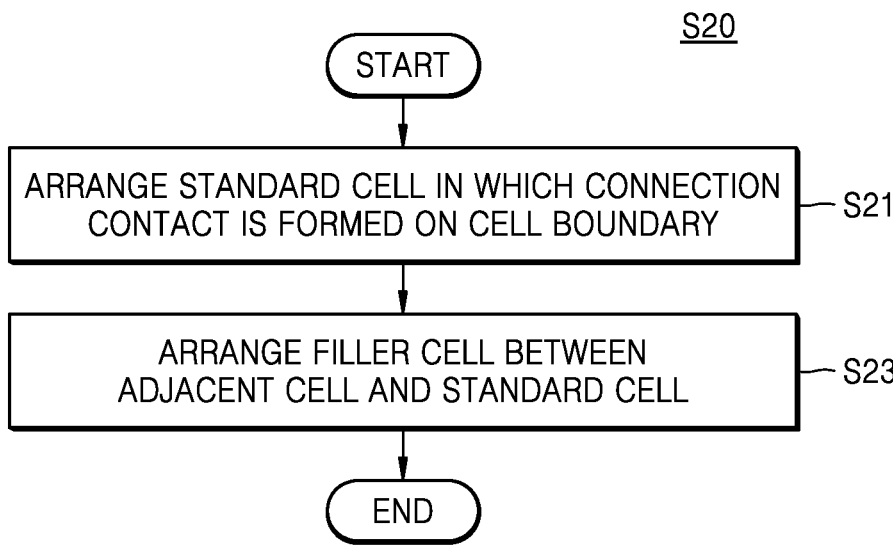
FIGS. 13 and 14 are flowcharts illustrating a method of designing an integrated circuit according to example embodiments.
Figure 14:
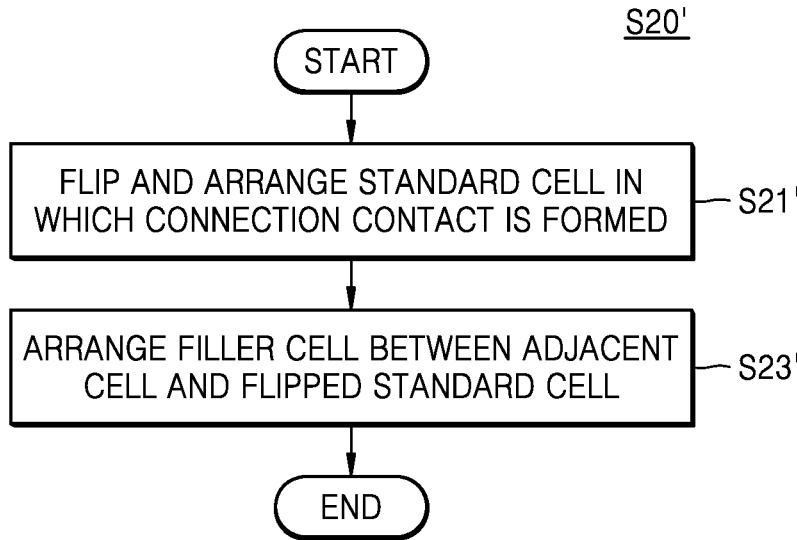

FIGS. 13 and 14 are flowcharts illustrating a method of designing an integrated circuit, according to example embodiments. Operation S20 of FIG. 13 and operation S20' of FIG. 14 are examples of operation S20 of FIG. 12, and may be performed by referring to the standard cell library D10 of FIG. 12.

Referring to FIG. 13, in operation S21, a standard cell, in which a connection contact is formed on a cell boundary, may be arranged. In operation S23, a filler cell may be arranged between an adjacent cell and the standard cell. Here, the adjacent cell may be an adjacent cell arranged adjacent to the cell boundary on which the connection contact of the standard cell is formed. The connection contact extends to the outside of the arranged standard cell, and thus, a design constraint may be needed for the adjacent cell arranged adjacent to the standard cell to satisfy a design rule. In addition, a connection metal line and/or a jumper formed on the connection contact extend to the outside of the standard cell, and thus, a design constraint may be needed for the adjacent cell. Accordingly, a space in which the connection contact will be formed on the cell boundary of the standard cell may be secured and formed by arranging the filler cell between the standard cell and the adjacent cell.

However, similar to the first standard cell STCA and the third standard cell STCC of FIG. 7, the standard cell STCA' of FIG. 9, and the fourth standard cell STCD of FIG. 10, when the separation space is formed in the adjacent cell, and the connection metal line of the standard cell is arranged on a track where the separation space of the adjacent cell is formed, operation S23 may not be performed. For example, an integrated circuit may be designed such that the standard cell and the adjacent cell are immediately adjacent to each other.

Referring to FIG. 14, in operation S21', a standard cell, in which a connection contact is formed, may be flipped and arranged. The flipping and arrangement of the standard cell may indicate that the standard cell is symmetrically arranged in a Y-axis direction (in a left and right direction). In operation S23', a filler cell may be arranged between an adjacent cell and the flipped standard cell. Here, the adjacent cell may be an adjacent cell arranged adjacent to a cell boundary on which the connection contact of the flipped standard cell is formed. Accordingly, a space in which the connection contact will be formed on the cell boundary of the flipped standard cell may be secured and formed.

However, similar to the first standard cell STCA and the third standard cell STCC of FIG. 7, the standard cell STCA' of FIG. 9, and the fourth standard cell STCD of FIG. 10, when the separation space SP is formed in the adjacent cell, and the connection metal line of the standard cell is arranged on a track where the separation space SP of the adjacent cell is defined, operation S23' may not be performed. For example, an integrated circuit may be designed such that the flipped standard cell and the adjacent cell are immediately adjacent to each other.

Figure 15:
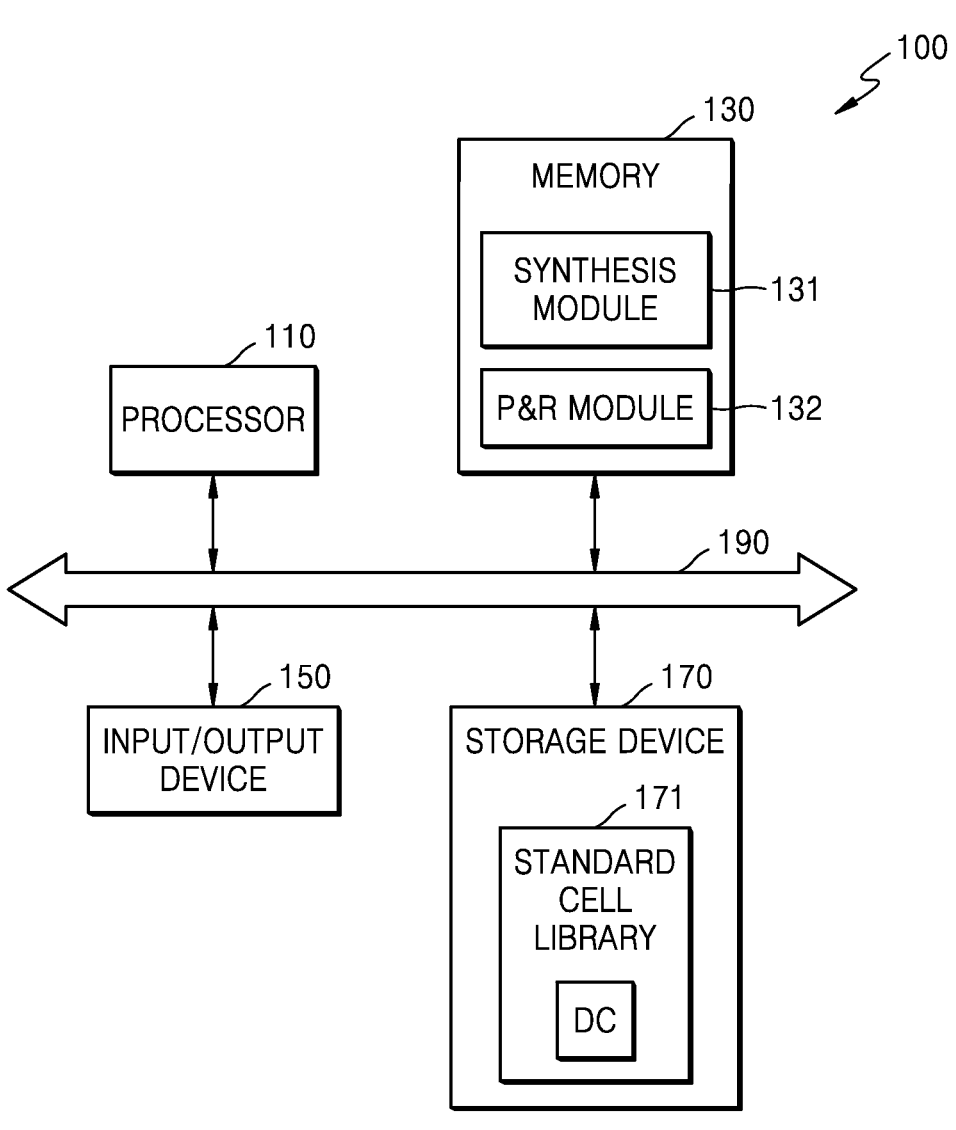
FIG. 15 is a block diagram illustrating a computing system for designing an integrated circuit according to an example embodiment.

FIG. 15 is a block diagram illustrating a computing system for designing an integrated circuit according to an example embodiment.

Referring to FIG. 15, a computing system 100 (hereinafter, referred to as an integrated circuit design system) for designing an integrated circuit may include a processor 110, a memory 130, an input/output device 150, a storage device 170, and a bus 190. The integrated circuit design system 100 may perform an integrated circuit design operation including operations S10 and S20 of FIG. 12, and may perform an integrated circuit design operation including operations S21 and S23 of FIG. 13 and operations S21' and S23' of FIG. 14. In an example embodiment, the integrated circuit design system 100 may be implemented as an integrated device, and thus may also be referred to as an integrated circuit design device. The integrated circuit design system 100 may be provided as a dedicated device for designing an integrated circuit of a semiconductor device, or may be a computer for driving various types of simulation tools or design tools. The integrated circuit design system 100 may be a stationary computing system such as a desktop computer, a workstation, or a server, or may be a portable computing system such as a laptop computer.

The processor 110 may be configured to execute instructions performing at least one of various operations for designing an integrated circuit. For example, the processor 110 may include a core configured to execute a set of any instructions (e.g., Intel Architecture-32 (IA-32), 64-bit extended IA-32, x86-64, PowerPC, Sparc, MIPS, ARM, IA-64, and the like), such as, for example, a microprocessor, an application processor (AP), a digital signal processor (DSP), or a graphics processing unit (GPU). The processor 110 may communicate with the memory 130, the input/output device 150, and the storage device 170 via the bus 190. The processor 110 may execute a design operation of the integrated circuit by driving a synthesis module 131 and a P&R module 132 loaded into the memory 130.

The memory 130 may store the synthesis module 131 and the P&R module 132. The synthesis module 131 and the P&R module 132 may be loaded into the memory 130 from the storage device 170. The synthesis module 131 may be, for example, a program including a plurality of instructions for performing the logic synthesis operation according to operation S10 of FIG. 12. The P&R module 132 may be, for example, a program including a plurality of instructions for performing a layout design operation according to operation S20 of FIG. 12, operations S21 and S23 of FIG. 13, and operations S21' and S23' of FIG. 14.

The memory 130 may further include a design rule check (DRC) module, and the processor 110 may determine whether or not a design rule error occurs, by driving the DRC module. When the design rule error occurs, the P&R module 132 may adjust a layout of an arranged standard cell. When the design rule error does not occur, a layout design of the integrated circuit may be completed.

The memory 130 may be a volatile memory such as static random access memory (SRAM) or dynamic RAM (DRAM), or a nonvolatile memory such as phase change RAM (PRAM), resistive RAM (ReRAM), nano floating gate memory (NFGM), polymer random access memory (PoRAM), magnetic RAM (MRAM), ferroelectric RAM (FRAM), or flash memory.

The input/output device 150 may control user input and output from user interface devices. For example, the input/output device 150 may include an input device such as a keyboard, a mouse, or a touch pad to receive input data that defines the integrated circuit, and the like. For example, the input/output device 150 may include an output device, such as a display or a speaker, to display an arrangement result, a routing result, layout data, a DRC result, and the like.

The storage device 170 may store programs such as the synthesis module 131 and the P&R module 132, and, before the programs are executed by the processor 110, the programs or at least a portion thereof may be loaded into the memory 130 from the storage device 170. The storage device 170 may also store data to be processed by the processor 110 or data processed by the processor 110. For example, the storage device 170 may store data (e.g., a standard cell library 171, netlist data, and the like) to be processed by programs such as the synthesis module 131 and the P&R module 132, and data (e.g., layout data and the like) generated by the programs. The standard cell library 171 stored in the storage device 170 may be the standard cell library D10 of FIG. 12.

For example, the storage device 170 may include a nonvolatile memory such as electrically erasable programmable read-only memory (EEPROM), flash memory, PRAM, RRAM, MRAM, or FRAM, or may include a storage medium such as a memory card (a multimedia card (MMC), an embedded multimedia card (eMMC), an SD, a micro secure digital (MicroSD) card, or the like), a solid state drive (SSD), a hard disk drive (HDD), a magnetic tape, an optical disk, or a magnetic disk. In addition, the storage device 170 may be removable from the integrated circuit design system 100.

While embodiments have been described with reference to the figures, it will be understood by those of ordinary skill in the art that various changes in form and details may be made therein without departing from the spirit and scope as defined by the following claims and their equivalents.

What is claimed is:

1. An integrated circuit comprising:
   a first standard cell comprising:
      a first metal layer comprising:
         a plurality of tracks respectively extending in a first horizontal direction and spaced apart from each other in a second horizontal direction; and
         a jog pattern that comprises a first conductive pattern and a second conductive pattern formed on the plurality of tracks, and
         a connection pattern formed off the plurality of tracks and connecting the first conductive pattern and the second conductive pattern between the first conductive pattern and the second conductive pattern;
      a plurality of gate lines respectively extending in the second horizontal direction; and
      a gate contact configured to connect a gate line selected from the plurality of gate lines to the first metal layer to connect the connection pattern to the selected gate line,
   wherein the connection pattern, the gate line, and the gate contact overlap with each other in a vertical direction that is perpendicular to the first horizontal direction and the second horizontal direction.

2. The integrated circuit of claim 1, wherein the jog pattern comprises an input pin.

3. The integrated circuit of claim 1, wherein the jog pattern comprises the first conductive pattern formed on a first track among the plurality of tracks and the second conductive pattern formed on a second track among the plurality of tracks.

4. The integrated circuit of claim 3, wherein the first track and the second track are adjacent to each other.

5. The integrated circuit of claim 3, wherein a third track is between the first track and the second track.

6. The integrated circuit of claim 3, wherein the first conductive pattern extends from the connection pattern in a reverse direction of the first horizontal direction, and the second conductive pattern extends from the connection pattern in the first horizontal direction.

7. The integrated circuit of claim 1, wherein the jog pattern comprise the first conductive pattern and the second conductive pattern formed on a first track of the plurality of tracks, and a third conductive pattern and a fourth conductive pattern formed on a second track of the plurality of tracks, and
   wherein the connection pattern is formed between each of the first conductive pattern, the second conductive pattern, the third conductive pattern, and the fourth conductive pattern, and connects the first conductive pattern, the second conductive pattern, the third conductive pattern, and the fourth conductive pattern to each other.

8. The integrated circuit of claim 1, wherein the first standard cell further comprises:
   a first active region and a second active region respectively extending in the first horizontal direction;

a plurality of vias configured to connect a drain region of the first active region to the first metal layer; and
a plurality of vias configured to connect a drain region of the second active region to the first metal layer.

9. The integrated circuit of claim 1, wherein the first standard cell further comprises:
   a first active region and a second active region respectively extending in the first horizontal direction;
   a plurality of vias configured to connect a source region of the first active region to the first metal layer; and
   a plurality of vias configured to connect a source region of the second active region to the first metal layer.

10. The integrated circuit of claim 9, further comprising a first power line and a second power line respectively configured to supply a voltage to the first standard cell, and formed on the first metal layer,
   wherein a pattern connected to a drain region of the first active region and formed on the first metal layer is in contact with the first power line, and a pattern connected to a drain region of the second active region and formed on the first metal layer is in contact with the second power line.

11. An integrated circuit comprising:
   a first standard cell defined by a cell boundary, the first standard cell comprising:
      a first active region and a second active region respectively extending in a first horizontal direction;
      a boundary area comprising a diffusion break configured to cut the first active region and the second active region, the boundary area being in contact with the cell boundary;
      a first active contact formed to contact the first active region;
      a second active contact formed to contact the second active region; and
      a connection contact formed in the boundary area, and extending in a second horizontal direction,
   wherein the connection contact is connected to the first active contact and the second active contact.

12. The integrated circuit of claim 11, wherein the first standard cell further comprises a first metal layer, and
   wherein the first active contact and the connection contact are connected to each other via a connection metal line in the first metal layer and a plurality of vias formed on a side of the connection metal line.

13. The integrated circuit of claim 12, wherein the first metal layer comprises:
   a plurality of tracks respectively extending in the first horizontal direction and spaced apart from each other in the second horizontal direction; and
   a separation space, excluding the connection metal line and in which a pattern is not formed, in a track on which the connection metal line is formed from among the plurality of tracks.

14. The integrated circuit of claim 11, wherein the first standard cell further comprises a jumper in contact with the first active contact and the connection contact.

15. The integrated circuit of claim 14, wherein the first standard cell further comprises:
   a plurality of gate lines respectively extending in the second horizontal direction; and
   a gate contact formed to contact the plurality of gate lines,
   wherein the jumper is formed on a same layer as the gate contact.

16. The integrated circuit of claim 11, wherein the first standard cell further comprises a first metal layer comprising a plurality of tracks respectively extending in the first horizontal direction and spaced apart from each other in the second horizontal direction, wherein the first metal layer comprises a conductive pattern formed on a track selected from the plurality of tracks, and a connection pattern formed off the plurality of tracks.

* * * * *